(12) United States Patent
Park

(10) Patent No.: US 11,469,247 B2
(45) Date of Patent: *Oct. 11, 2022

(54) SEMICONDUCTOR DEVICE AND MANUFACTURING METHOD OF A SEMICONDUCTOR DEVICE

(71) Applicant: SK hynix Inc., Icheon-si Gyeonggi-do (KR)

(72) Inventor: In Su Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 56 days.

This patent is subject to a terminal disclaimer.

(21) Appl. No.: 17/091,180

(22) Filed: Nov. 6, 2020

(65) Prior Publication Data

US 2021/0057447 A1    Feb. 25, 2021

Related U.S. Application Data

(63) Continuation of application No. 16/359,568, filed on Mar. 20, 2019, now Pat. No. 10,868,035.

(30) Foreign Application Priority Data

Aug. 10, 2018    (KR) .................... 10-2018-0093830

(51) Int. Cl.
*H01L 29/94* (2006.01)
*H01L 29/76* (2006.01)
(Continued)

(52) U.S. Cl.
CPC .. *H01L 27/11582* (2013.01); *H01L 27/11556* (2013.01); *H01L 27/249* (2013.01); *H01L 29/1037* (2013.01); *H01L 29/41741* (2013.01);

*H01L 29/456* (2013.01); *H01L 21/02236* (2013.01); *H01L 21/02532* (2013.01);
(Continued)

(58) Field of Classification Search
CPC ........ H01L 27/11582; H01L 27/11556; H01L 27/249; H01L 29/1037; H01L 29/41741; H01L 29/456; H01L 21/02236; H01L 21/02532; H01L 21/02636; H01L 21/31144; H01L 21/32139; H01L 29/40114; H01L 29/40117; H01L 27/2454; H01L 27/2481; H01L 29/66666; H01L 29/7827; H01L 27/2436; H01L 27/11524;
(Continued)

(56) References Cited

U.S. PATENT DOCUMENTS 9,406,694 B1    8/2016  Ikeno et al.
9,748,267 B2    8/2017  Zhang et al.
10,868,035 B2 * 12/2020  Park ................. H01L 29/66666

FOREIGN PATENT DOCUMENTS

KR    1020160049619 A    5/2016
KR    1020180133742 A    12/2018

* cited by examiner

*Primary Examiner* — Theresa T Doan
(74) *Attorney, Agent, or Firm* — William Park & Associates Ltd.

(57) ABSTRACT

A semiconductor device includes a stack structure, a channel layer passing through the stack structure, a memory layer enclosing the channel layer and including first and second openings which expose the channel layer, a well plate coupled to the channel layer through the first opening, and a source plate coupled to the channel layer through the second opening.

16 Claims, 25 Drawing Sheets

(51) Int. Cl.
  *H01L 27/11582* (2017.01)
  *H01L 29/10* (2006.01)
  *H01L 29/417* (2006.01)
  *H01L 29/45* (2006.01)
  *H01L 27/11556* (2017.01)
  *H01L 27/24* (2006.01)
  *H01L 21/02* (2006.01)
  *H01L 21/311* (2006.01)
  *H01L 21/3213* (2006.01)
  *H01L 21/28* (2006.01)

(52) U.S. Cl.
  CPC ... *H01L 21/02636* (2013.01); *H01L 21/31144* (2013.01); *H01L 21/32139* (2013.01); *H01L 29/40114* (2019.08); *H01L 29/40117* (2019.08)

(58) Field of Classification Search
  CPC ........... H01L 27/1157; H01L 29/66825; H01L 29/788
  USPC ....................................................... 257/314
  See application file for complete search history.

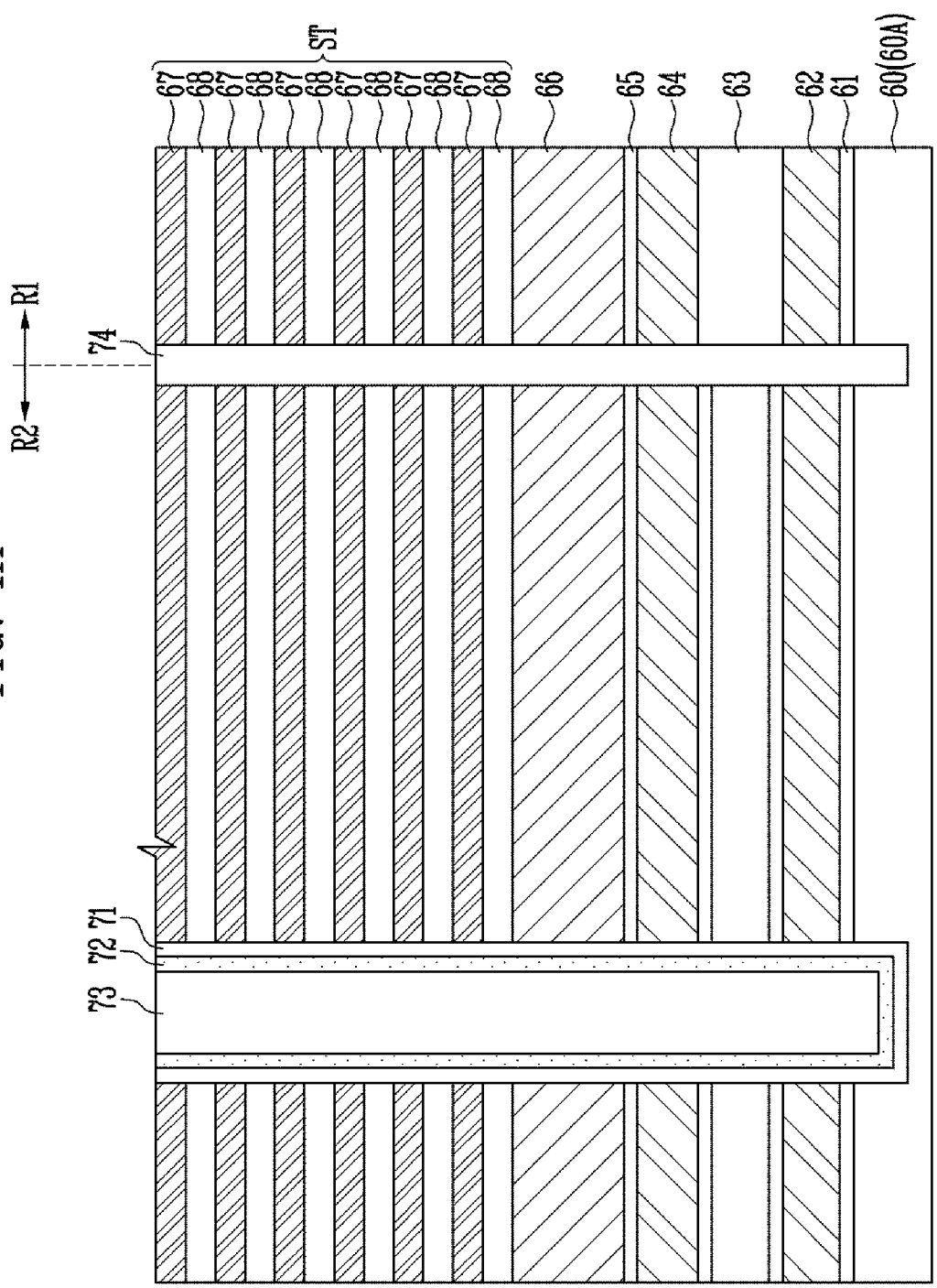

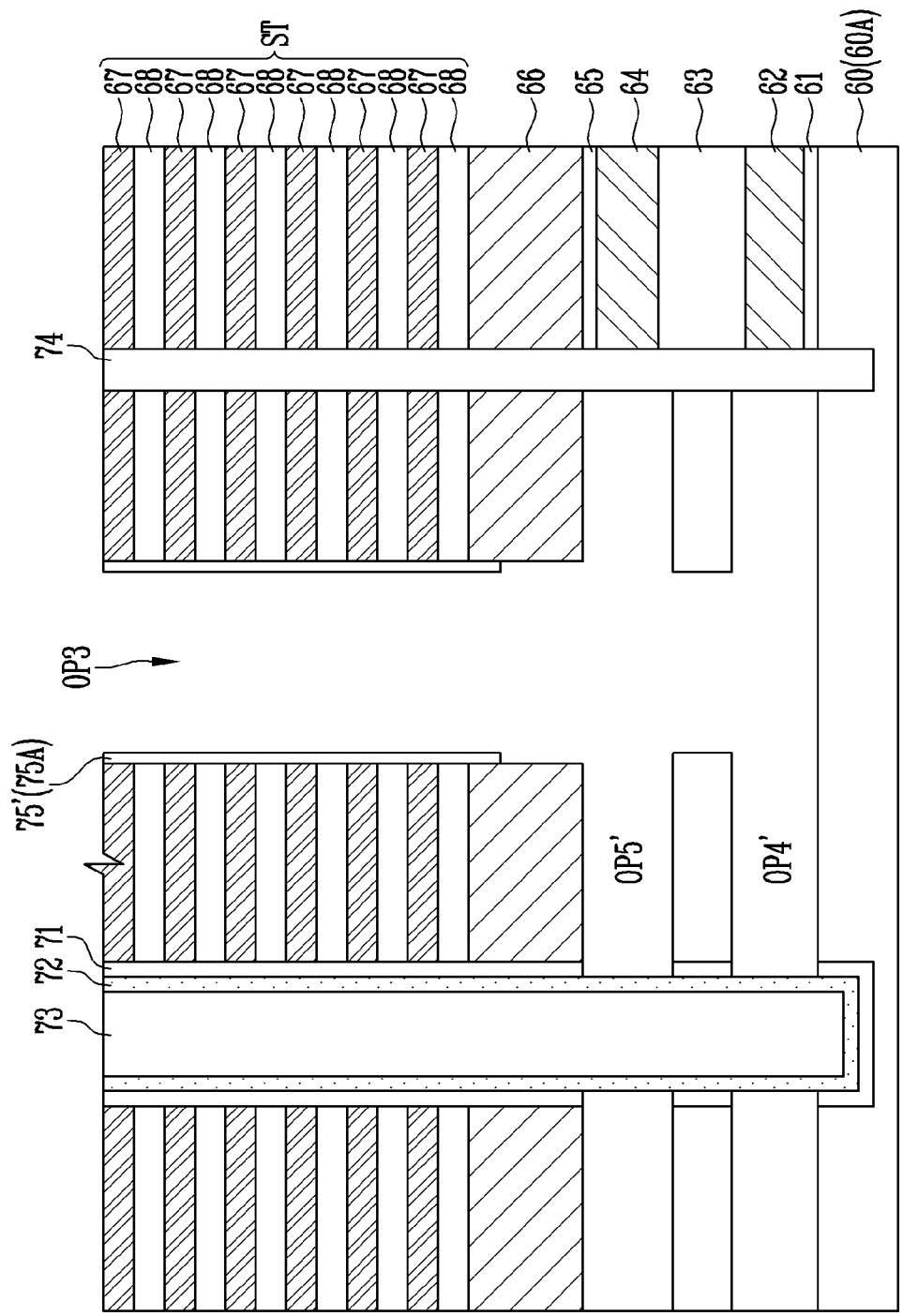

SEMICONDUCTOR DEVICE AND MANUFACTURING METHOD OF A SEMICONDUCTOR DEVICE

CROSS-REFERENCE TO RELATED APPLICATION

The present application is a continuation application of U.S. patent application Ser. No. 16/359,568, filed on Mar. 20, 2019, and claims priority under 35 U.S.C. § 119(a) to Korean patent application number 10-2018-0093830, filed on Aug. 10, 2018, in the Korean Intellectual Property Office, the entire disclosure of which is incorporated herein by reference.

BACKGROUND

1. Technical Field

Various embodiments generally relate to an electronic device, and more particularly, to a semiconductor device and a manufacturing method of a semiconductor device.

2. Related Art

Non-volatile memory devices retain stored data independent of the availability of power. Integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes alternately stacked with each other, with channel layers passing therethrough and memory cells may be stacked along the channel layers. Various structures and manufacturing methods have been developed to improve the operational reliability of three-dimensional non-volatile memory devices.

SUMMARY

According to an embodiment, a semiconductor device may include a stack structure, a channel layer passing through the stack structure, a memory layer enclosing the channel layer and including first and second openings which expose the channel layer, a well plate coupled to the channel layer through the first opening, and a source plate coupled to the channel layer through the second opening.

According to an embodiment, a semiconductor device may include a base including a well region doped with an impurity, a well plate on the base, a source plate on the well plate, an insulating layer interposed between the well plate and the source plate, wherein the insulating layer electrically insulates the well plate from the source plate. The semiconductor device may also include a stack structure disposed above the source plate, wherein the stack structure includes conductive layers and insulating layers alternately stacked with each other. The semiconductor device may further include a source connection structure passing through the stack structure, wherein the source connection structure is electrically coupled to the source plate and electrically insulated from the conductive layers and the well plate. The semiconductor device may additionally include a well connection structure electrically coupled to the well plate and electrically insulated from the source plate and the conductive layers, wherein the well connection structure extends through the conductive layers and through the well plate into the well region.

According to an embodiment, a method of manufacturing a semiconductor device may include forming a second sacrificial layer on a first sacrificial layer, forming a stack structure on the second sacrificial layer, forming a channel layer passing through the stack structure, the second sacrificial layer, and the first sacrificial layer, forming first and second openings separated from each other by removing the first and second sacrificial layers, forming a first conductive plate coupled to the channel layer in the first opening, and forming a second conductive plate coupled to the channel layer in the second opening.

According to an embodiment, a method of manufacturing a semiconductor device may include forming a second sacrificial layer on a first sacrificial layer, forming a stack structure on the second sacrificial layer, forming a channel layer passing through the stack structure, the second sacrificial layer and the first sacrificial layer, forming first and second openings separated from each other by removing the first and second sacrificial layers, forming a well plate coupled to the channel layer in the first opening, and forming a source plate coupled to the channel layer in the second opening.

BRIEF DESCRIPTION OF THE DRAWINGS

FIGS. 4A, 4B, 4C, 4D, 4E, 4F, 4G, 4H, and 4I are cross-sectional diagrams illustrating a method of manufacturing a semiconductor device, according to an embodiment.

DETAILED DESCRIPTION

Figure 1A:
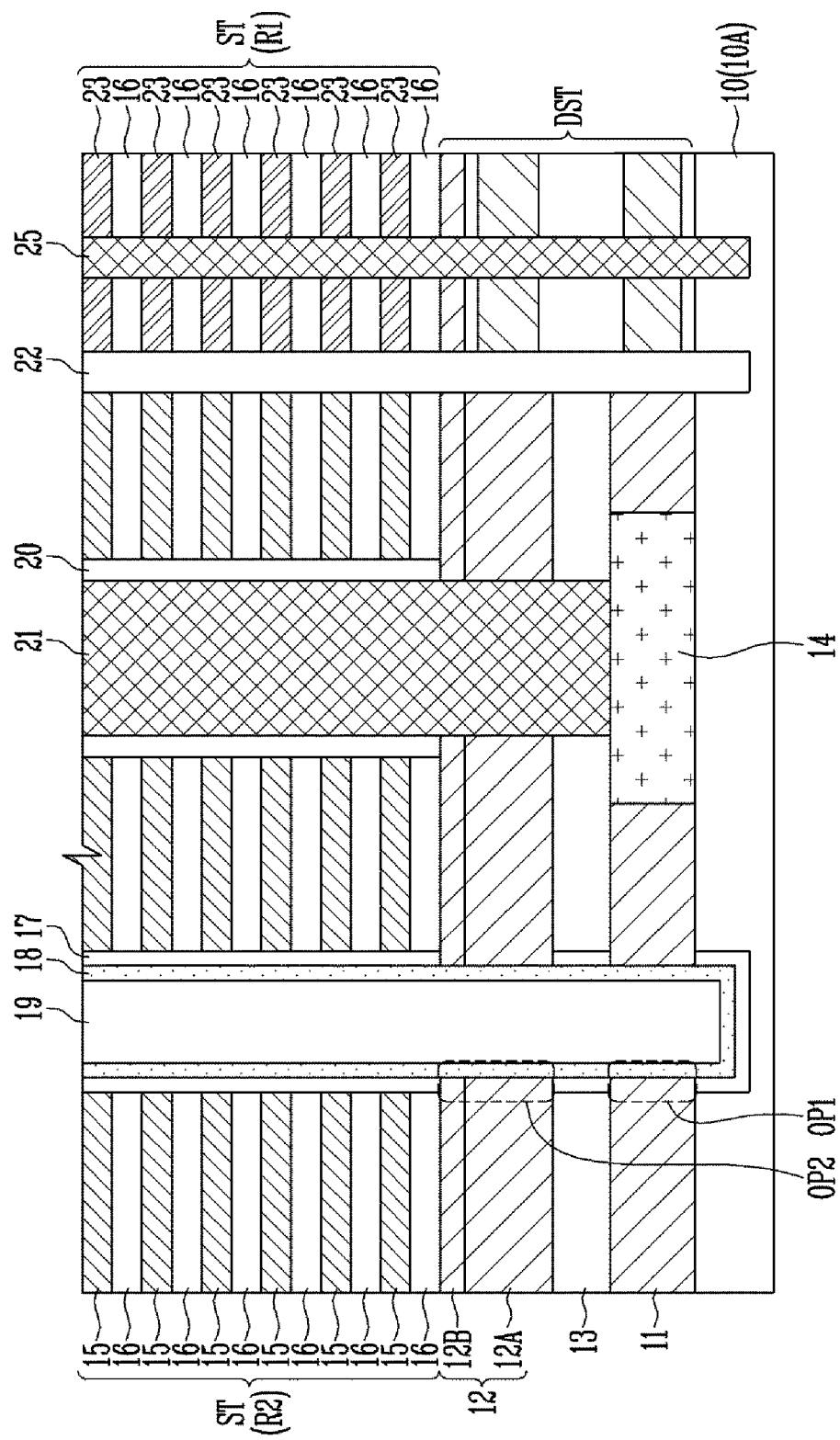
FIGS. 1A, 1B, and 1C are cross-sectional diagrams illustrating the structure of a semiconductor device, according to an embodiment.

Hereinafter, various embodiments are described with reference to the accompanying drawings. In the drawings, thicknesses and lengths of components may be exaggerated for convenience of illustration. In the following description, a description of related functions and constitutions may be omitted for simplicity and conciseness. Like reference numerals refer to like elements throughout the specification and drawings.

It is also noted that in this specification, "connected/coupled" refers to one component not only directly coupled to another component but also indirectly coupled to another component through an intermediate component. In the specification, when an element is referred to as "comprising" or "including" a component, it does not exclude the inclusion of other additional components unless a description to the contrary is specifically pointed out in context. Further, the word "on," as used herein can imply a second component being either directly or indirectly over a first component. For example, a second sacrificial layer being formed on a first sacrificial layer does not exclude an embodiment in which an insulating layer is disposed between the first and second sacrificial layers. Further, a source plate being formed on a well plate does not exclude an embodiment in which an insulating layer is disposed between the source plate and the well plate.

Figure 1B:
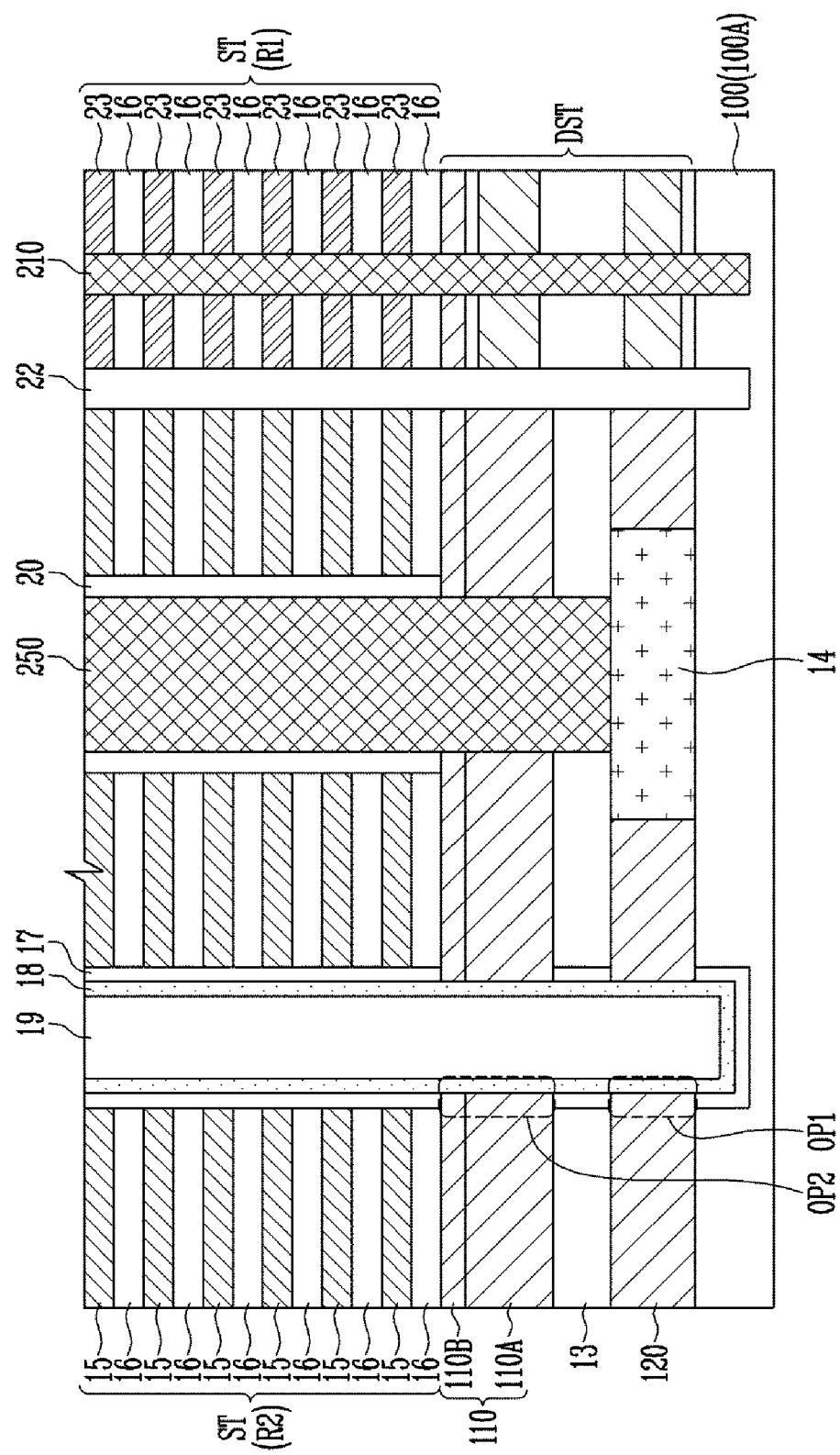
Figure 1C:
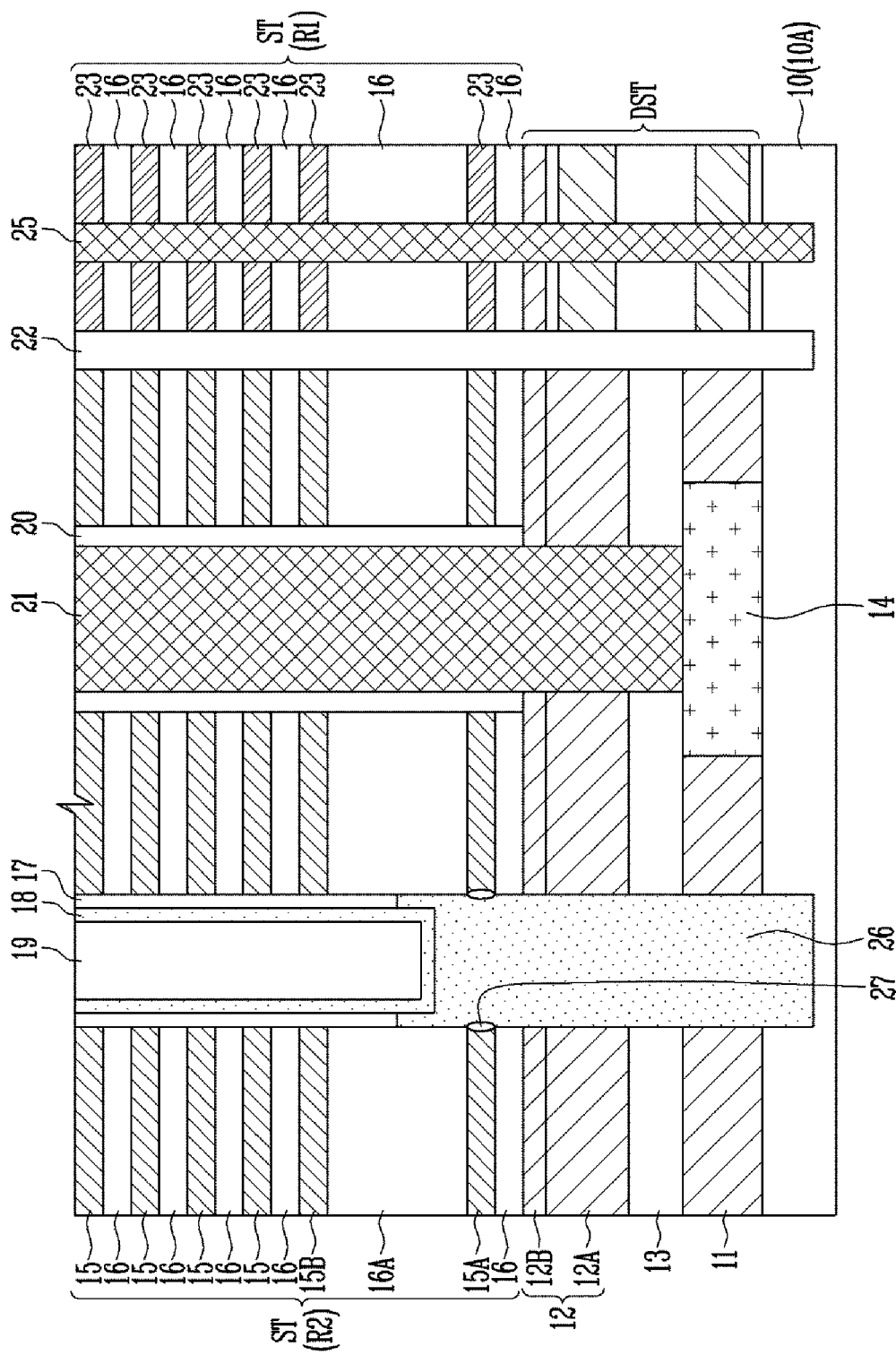

FIGS. 1A, 1B, and 1C are cross-sectional diagrams illustrating the structure of a semiconductor device, according to an embodiment.

Referring to FIG. 1A, the semiconductor device may include a stack structure ST, a channel layer 18, a source plate 12, and a well plate 11. In addition, the semiconductor device may further include a base 10, an insulating layer 13, an insulating pattern 14, a memory layer 17, a gap-fill layer 19, an insulating spacer 20, a source connection structure 21, a slit insulating structure 22, a well connection structure 25, and the like.

The stack structure ST may be disposed above the base 10. The well plate 11, the source plate 12, the insulating layer 13, and the like may be interposed between the base 10 and the stack structure ST. The base 10 may be a substrate, a semiconductor substrate, or a deposition layer including polysilicon and the like. In addition, the base 10 may include an N-type or P-type impurity. For example, the base 10 may include a well region 10A doped with a P-type impurity. In addition, although not illustrated in FIG. 1A, a peripheral circuit may be disposed under the base 10. The peripheral circuit may be disposed below a cell array.

The stack structure ST may include conductive layers 15 and insulating layers 16 alternately stacked with each other. The conductive layers 15 may be gate electrodes of a select transistor, a memory cell, and the like. At least one uppermost conductive layer 15 among the conductive layers 15 may be a gate electrode of an upper select transistor. At least one lowermost conductive layer 15 among the conductive layers 15 may be a gate electrode of a lower select transistor. The other conductive layers 15 may be gate electrodes of memory cells. The conductive layers 15 may include metal, such as tungsten, polysilicon, or a combination thereof. In addition, the insulating layers 16 may be provided to insulate the stacked conductive layers 15 from each other. The insulating layers 16 may include an insulating material such as an oxide.

The stack structure ST may include first and second regions R1 and R2. The first region R1 may be a cell region in which stacked memory cells are disposed. In addition, an interconnection coupled to a peripheral circuit disposed under the base 10 may be disposed at the second region R2. The stack structure ST may include a connection region for applying biases to gate electrodes of stacked memory cells. The connection region may be patterned into a step shape. The second region R2 may be disposed in the connection region.

The first region R1 and the second region R2 may include different materials from each other. The first region R1 may include sacrificial layers 23 and the insulating layers 16 alternately stacked with each other. The second region R2 may include the conductive layers 15 and the insulating layers 16 alternately stacked with each other. Insulating layers 16 included in the first region R1 and the second region R2 which are disposed on the same level may be coupled to each other to form a single layer.

The slit insulating structure 22 may pass through the stack structure ST and may be disposed at a boundary between the first region R1 and the second region R2. The slit insulating structure 22 may separate the first region R1 and the second region R2 from each other. For example, the slit insulating structure 22 may have a loop shape isolating the first region R1.

Each of the channel layers 18 may be a channel layer of a select transistor or a memory cell. The channel layer 18 may include a semiconductor material, such as silicon (Si), germanium (Ge), or the like. The channel layer 18 may pass through the second region R2 of the stack structure ST. In addition, the channel layer 18 may include a penetrating portion passing through the stack structure ST and a protruding portion protruding from a lower surface of the stack structure ST. The protruding portion of the channel layer 18 may pass through the source plate 12, the insulating layer 13, and the well plate 11 and may extend to the base 10.

A central portion of each of the channel layers 18 may be filled or opened to have a tube shape. When the channel layer 18 has a tube shape, the gap-fill layer 19 may be formed in the channel layer 18. The gap-fill layer 19 may include an insulating material, such as an oxide.

The memory layer 17 may enclose a sidewall of the channel layer 18. The memory layer 17 may include at least one of a tunnel insulating layer, a data storing layer, and a charge blocking layer. Each of the data storage layers may include a floating gate, a charge trapping material, silicon, a nitride, a nanodot, a variable resistance material, a phase-change material, and the like.

The memory layer 17 may include a first opening OP1 and a second opening OP2 which expose the channel layer 18. The first and second openings OP1 and OP2 may expose the sidewall of the channel layer 18 and may be disposed to be spaced apart from each other. For example, the memory layer 17 may be interposed between the channel layer 18 and the stack structure ST, between the channel layer 18 and the insulating layer 13, and between the channel layer 18 and the base 10.

The source plate 12 may be disposed under the stack structure ST and coupled to the channel layer 18 through the second opening OP2 of the memory layer 17. For example, the source plate 12 may pass through the memory layer 17 to contact the sidewall of the channel layer 18, and may be directly coupled to the channel layer 18. The source plate 12 may include polysilicon.

The source plate 12 may be a single layer or include multiple layers. For example, the source plate 12 may include a first conductive layer 12A and a second conductive layer 12B on the first conductive layer 12A. The first conductive layer 12A may be an undoped polysilicon layer, and the second conductive layer 12B may be a doped polysilicon layer. In addition, the second conductive layer 12B may include an N-type impurity. Accordingly, the source plate 12 may provide electrons from the second conductive layer 12B during a program operation, and the first conductive layer 12A may serve as a program path for providing electrons to the channel layer 18.

The well plate 11 may be disposed under the stack structure ST and coupled to the channel layer 18 through the first opening OP1 of the memory layer 17. For example, the well plate 11 may pass through the memory layer 17 to contact the sidewall of the channel layer 18, and may be directly coupled to the channel layer 18. The well plate 11 may include polysilicon and may be an undoped polysilicon layer. In addition, the well plate 11 may be a single layer or include multiple layers.

The well plate 11 may contact the well region 10A in the base 10. Accordingly, a positive hole may be provided from the well region 10A, and the well plate 11 may serve as an erase path for providing a positive hole to the channel layer 18 during an erase operation.

Each of the source plate 12 and the well plate 11 may have a plate structure extending in parallel to a surface of the base 10. The source plate 12 and the well plate 11 may be insulated from each other by the insulating layer 13 interposed therebetween. The source plate 12 and the well plate 11 may be disposed under the second region R2 of the stack structure ST only, or may be disposed under the first and second regions R1 and R2. In addition, the source plate 12 and the well plate 11 may have the substantially same thickness as each other, or may have different thicknesses from each other. Although FIG. 1A illustrates the structure in which the well plate 11 is disposed under the source plate 12, the source plate 12 may be disposed under the well plate 11 in other embodiments.

The source connection structure 21 may be an interconnection structure for applying a bias to the source plate 12, may pass through the stack structure ST, and may be electrically coupled to the source plate 12. For example, the source connection structure 21 may pass through the second region R2 of the stack structure ST. In addition, the source connection structure 21 may include metal, such as tungsten, polysilicon, or a combination thereof. Accordingly, the insulating spacer 20 may be formed on a sidewall of the source connection structure 21 to insulate the source connection structure 21 and the conductive layers 15 from each other. The insulating spacer 20 may include an insulating material, such as an oxide.

The source connection structure 21 may pass through the source plate 12 and directly contact the source plate 12. In addition, the source connection structure 21 may extend beyond a lower surface of the source plate 12 to partially or completely pass through the insulating layer 13. Accordingly, the insulating pattern 14 may be disposed under the source connection structure 21 to prevent the source connection structure 21 from being electrically coupled to the well plate 11. The insulating pattern 14 may include an insulating material, such as an oxide, and may be disposed at a level corresponding to the well plate 11.

A dummy stack structure DST may be disposed between the first region R1 of the stack structure ST and the base 10. The dummy stack structure DST may be remaining layers used during a process for forming the well plate 11 and the source plate 12. The dummy stack structure DST may include a conductive material, but may be isolated from surrounding layers by the slit insulating structure 22. In other words, the dummy stack structure DST may be electrically separated from the well plate 11 and the source plate 12, and may be in a floating state.

The well connection structure 25 may be an interconnection structure for applying a bias to the well plate 11 and may pass through the first region R1 of the stack structure ST and the dummy stack structure DST to be coupled to the base 10. The well connection structure 25 may be electrically separated from the source plate 12 and may be electrically coupled to the well plate 11 through the well region 10A. For example, the well connection structure 25 may include metal, such as tungsten, polysilicon, or a combination thereof.

According to the above-described structure, a path of a program/read operation and a path of an erase operation may be separated from each other. For example, electrons may be provided from the source plate 12 to the channel layer 18, and the source plate 12 may serve as a program path during a program operation. A current may flow from the channel layer 18 to the source connection structure 21 through the source plate 12, and the source plate 12 may serve as a read path during a read operation. In addition, when an erase bias is applied to the well connection structure 25, a positive hole may be provided from the well region 10A to the channel layer 18 through the well plate 11 during an erase operation. In other words, the well plate 11 may serve as an erase path. Because the source plate 12 and the well plate 11 are electrically separated from each other by the insulating layer 13, a path of a program/read operation and a path of an erase operation may be separated from each other. Accordingly, interference between a program/read operation and an erase operation may be decreased compared to a device using a common program/read and erase path. Thereby, the operational efficiency of the memory device may be improved.

According to FIG. 1B, a structure of the semiconductor device may be similar to the structure as described above for FIG. 1A, but configured such that a source plate 120 may be disposed under a well plate 110. The source plate 120 may be coupled to the channel layer 18 through the first opening OP1 of the memory layer 17, and the well plate 110 may be coupled to the channel layer 18 through the second opening OP2 of the memory layer 17.

The well plate 110 may be a single layer or include multiple layers. For example, the well plate 110 may include a first conductive layer 110A and a second conductive layer 110B on the first conductive layer 110A. The first conductive layer 110A may be an undoped polysilicon layer, and the second conductive layer 110B may be a doped polysilicon layer. In addition, the second conductive layer 110B may include a P-type impurity. Accordingly, the well plate 110 may provide a positive hole from the second conductive layer 110B during an erase operation, and the well plate 110 may serve as an erase path for providing a positive hole to the channel layer 18.

The source plate 120 may include polysilicon, and may be an undoped polysilicon layer. In addition, the source plate 120 may be a single layer or may include multiple layers. A base 100 may include a source region 100A doped with an N-type impurity, and the source plate 120 may contact the source region 100A in the base 100. Accordingly, electrons may be provided from the source region 100A and the source plate 120 may serve as a program path for supplying electrons to the channel layer 18 during a program operation. In addition, a current may flow from the channel layer 18 to a source connection structure 210 through the source plate 120 and the source region 100A, and the source plate 120 may serve as a read path during a read operation. A well connection structure 250 may pass through the stack structure ST and the well plate 110 and extend to the insulating pattern 14. The well connection structure 250 may be electrically connected to the well plate 110 and may be electrically isolated from the source plate 120 by the insulating pattern 14.

According to FIG. 1C, a structure of the semiconductor device may be similar to the structure as described above for FIG. 1A, but configured such that a semiconductor pattern 26 may be additionally formed under the channel layer 18. The semiconductor pattern 26 may have a pillar shape contacting the base 10 and protruding from an upper surface of the base 10. In addition, when the base 10 includes a groove on the upper surface thereof, the semiconductor pattern 26 may fill the groove. For example, the semiconductor pattern 26 may include a single crystal silicon layer, polysilicon layer, and the like, which are formed using Selective Epitaxial Growth from the base 10.

The semiconductor pattern 26 may be coupled to the channel layer 18. For example, the semiconductor pattern 26 may include a groove on an upper surface thereof, and the channel layer 18 may be formed to fill at least a part of the groove. The semiconductor pattern 26 may contact the channel layer 18 and may be electrically coupled to the channel layer 18.

The semiconductor pattern 26 may pass through the well plate 11, the insulating layer 13, and the source plate 12. A sidewall of the semiconductor pattern 26 may directly contact the well plate 11 and the source plate 12. Accordingly, the channel layer 18 may be electrically coupled to the well plate 11 or the source plate 12 through the semiconductor pattern 26.

The semiconductor pattern 26 may pass through a lowermost conductive layer 15A of the stack structure ST. An upper surface of the semiconductor pattern 26 may be disposed higher than an upper surface of the lowermost conductive layer 15A, and lower than a lower surface of a conductive layer 15B. An insulating layer 16A interposed between the lowermost conductive layer 15A and the conductive layer 15B may have a greater thickness than each of the rest of the insulating layers 16. In addition, a gate insulating layer 27 may be interposed between the semiconductor pattern 26 and the lowermost conductive layer 15A. The gate insulating layer 27 may include an oxide and may be an oxide layer which is formed by oxidizing the sidewall of the semiconductor pattern 26.

According to the above-described structure, the semiconductor pattern 26 together with the channel layer 18 may provide an erase path or a program/read path. In addition, the semiconductor pattern 26 may be formed under the channel layer 18 and the channel layer 18 may be coupled to the source plate 12 and the well plate 11 through the semiconductor pattern 26.

Figure 2A:
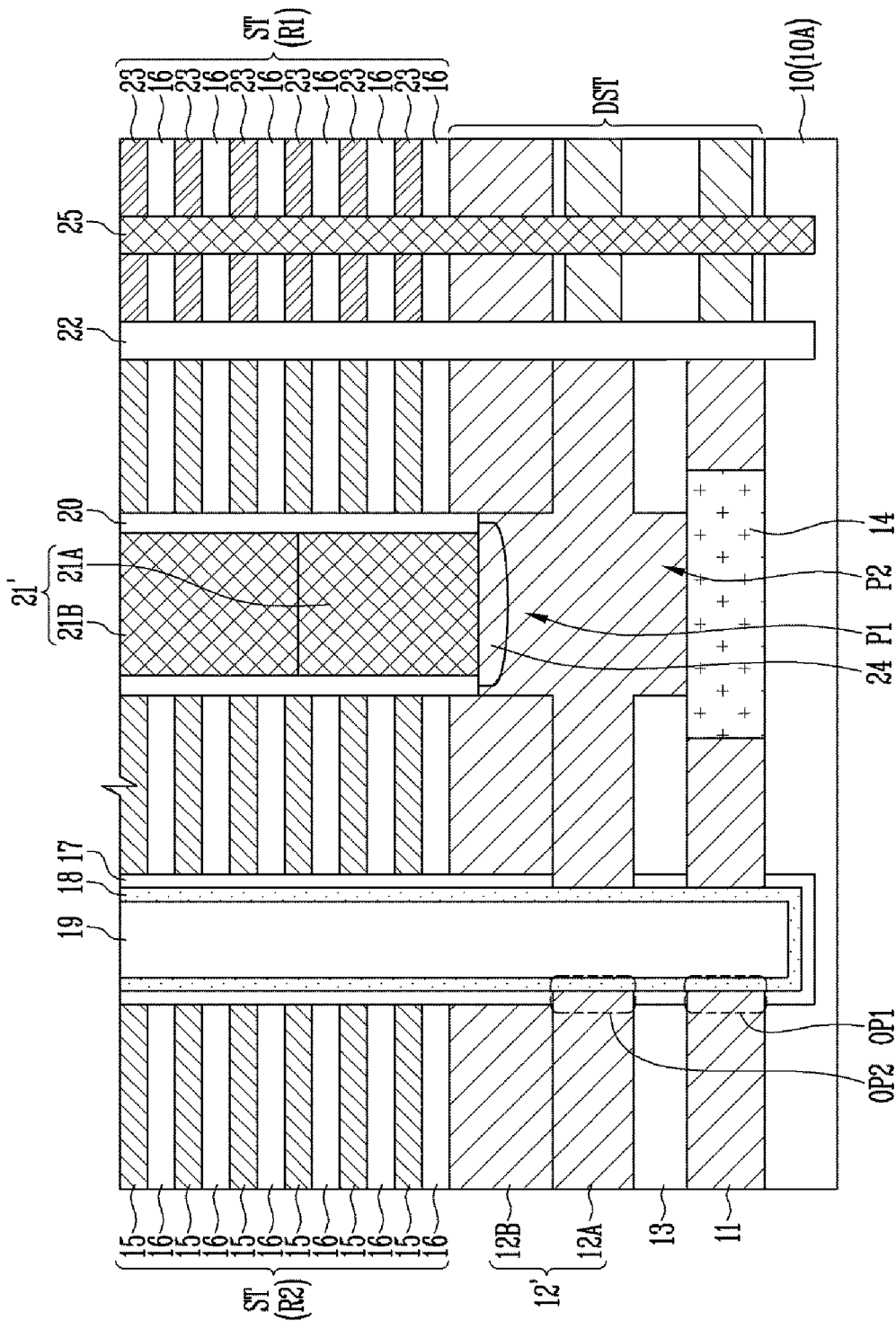
FIGS. 2A and 2B are cross-sectional diagrams illustrating the structure of a semiconductor device, according to an embodiment.
Figure 2B:
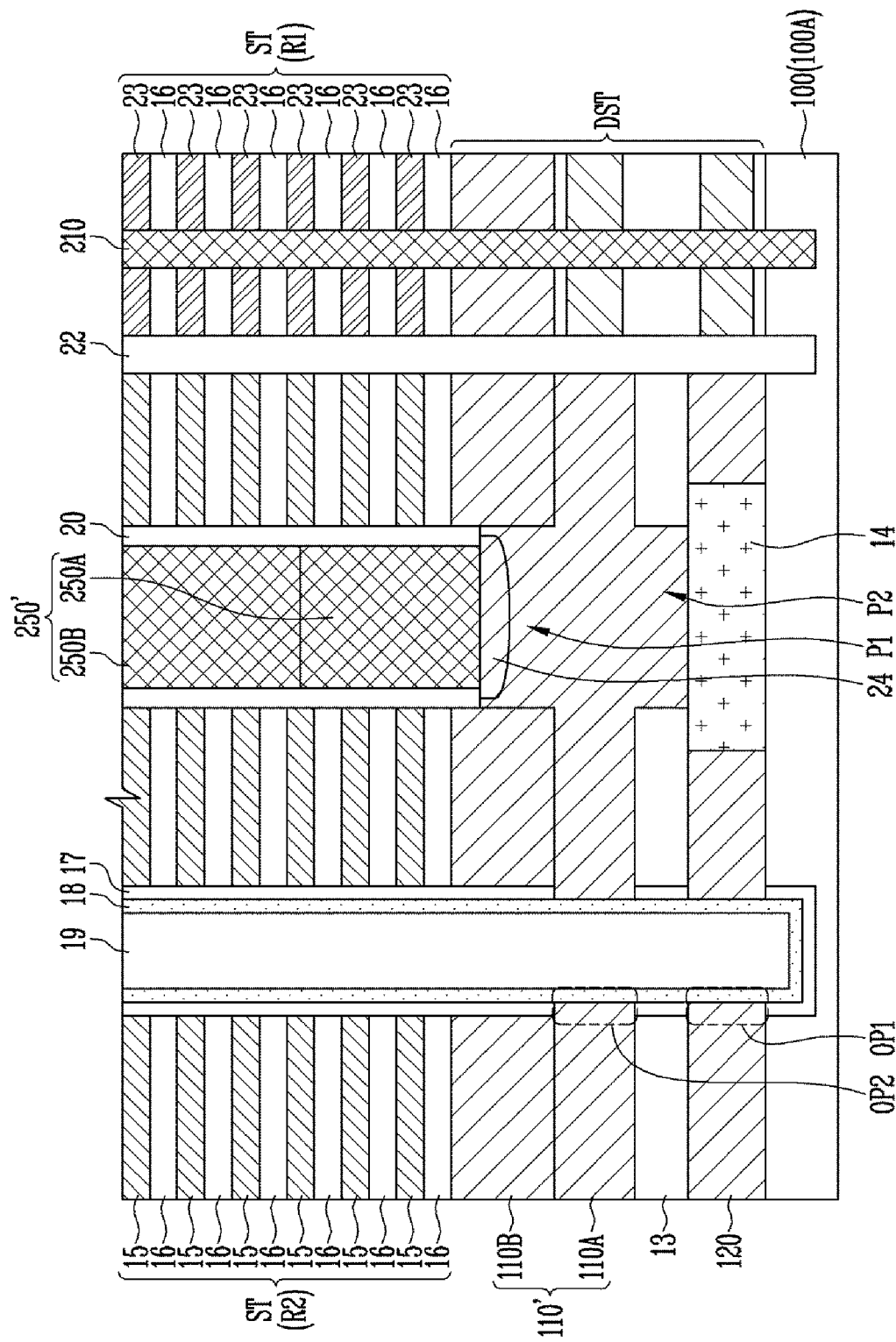

FIGS. 2A and 2B are cross-sectional diagrams illustrating the structure of a semiconductor device, according to an embodiment. Repetitive descriptions of components already described above are omitted below.

Referring to FIG. 2A, a source plate 12' may have a multi-layered structure. For example, the source plate 12' may include the first conductive layer 12A and the second conductive layer 12B. The first conductive layer 12A may be an undoped polysilicon layer and the second conductive layer 12B may be a doped polysilicon layer. For example, the second conductive layer 12B may include an N-type impurity.

The first conductive layer 12A may be directly coupled to the channel layer 18 through the second opening OP2 of the memory layer 17. The memory layer 17 may be interposed between the channel layer 18 and the second conductive layer 12B, and the second conductive layer 12B may be coupled to the channel layer 18 through the first conductive layer 12A. Although FIG. 2A illustrates an example in which the memory layer 17 is interposed between the channel layer 18 and the second conductive layer 12B, the first conductive layer 12A may protrude between the channel layer 18 and the second conductive layer 12B.

The first conductive layer 12A may include first and second protruding portions P1 and P2 disposed under a source connection structure 21'. The first protruding portion P1 may protrude from an upper surface of the first conductive layer 12A and contact a sidewall of the second conductive layer 12B. Accordingly, impurities in the second conductive layer 12B may diffuse into the first protruding portion P1, and at least some region of the first protruding portion P1 may have a higher impurity concentration than outside the region. The second protruding portion P2 may protrude from a lower surface of the first conductive layer 12A and contact the insulating pattern 14.

The source connection structure 21' may include a first conductive pattern 21A and a second conductive pattern 21B. The first conductive pattern 21A may be directly coupled to the source plate 12' and the second conductive pattern 21B may be coupled to the first conductive pattern 21A. The first conductive pattern 21A and the second conductive pattern 21B may have different resistance values from each other, and the second conductive pattern 21B may have a lower resistance value than the first conductive pattern 21A. For example, the first conductive pattern 21A may include polysilicon and the second conductive pattern 21B may include metal, such as tungsten.

The source connection structure 21' may contact the first protruding portion P1 of the source plate 12'. Accordingly, a junction 24 may be formed in the first protruding portion P1 to decrease a contact resistance between the source plate 12' and the source connection structure 21'.

According to FIG. 2B, a structure of the semiconductor device may be similar to the structure as described above for FIG. 2A, but configured such that the source plate 120 is disposed under a well plate 110'. The source plate 120 may be coupled to the channel layer 18 through the first opening OP1 of the memory layer 17, and the well plate 110' may be coupled to the channel layer 18 through the second opening OP2 of the memory layer 17.

The well plate 110' may be a single layer or include multiple layers. For example, the well plate 110' may include the first conductive layer 110A and the second conductive layer 110B on the first conductive layer 110A. The first conductive layer 110A may be an undoped polysilicon layer, and the second conductive layer 110B may be a doped polysilicon layer. In addition, the second conductive layer 110B may include a P-type impurity. Accordingly, the well plate 110' may provide a positive hole from the second conductive layer 110B during an erase operation, and the well plate 110' may serve as an erase path for providing a positive hole to the channel layer 18.

The source plate 120 may include polysilicon, and may be an undoped polysilicon layer. In addition, the source plate 120 may be a single layer or include multiple layers. The base 100 may include the source region 100A doped with an N-type impurity, and the source plate 120 may contact the source region 100A in the base 100. Accordingly, electrons may be provided from the source region 100A, and the source plate 120 may serve as a program path for supplying electrons to the channel layer 18 during a program operation. In addition, a current may flow from the channel layer 18 to the source connection structure 210 through the source plate 120 and the source region 100A, and the source plate 120 may serve as a read path during a read operation.

A well connection structure 250' may include a first conductive pattern 250A and a second conductive pattern 250B. The first conductive pattern 250A may be directly coupled to the well plate 110' and the second conductive pattern 250B may be coupled to the first conductive pattern 250A. The first conductive pattern 250A and the second conductive pattern 250B may have different resistance values from each other, and the second conductive pattern 250B may have a lower resistance value than the first conductive pattern 250A. For example, the first conductive pattern 250A may include polysilicon and the second conductive pattern 250B may include metal, such as tungsten.

As described above with reference to FIG. 1C, the semiconductor pattern 26 may be formed under the channel layer 18 of FIGS. 2A and 2B, and the channel layer 18 and each of the source plates 12' and 120 or each of the well plates 11 and 110' may be coupled through the semiconductor pattern 26.

FIGS. 3A to 3I are cross-sectional diagrams illustrating a method of manufacturing a semiconductor device, according to an embodiment. Repetitive descriptions of components already described above are omitted below.

Figure 3A:
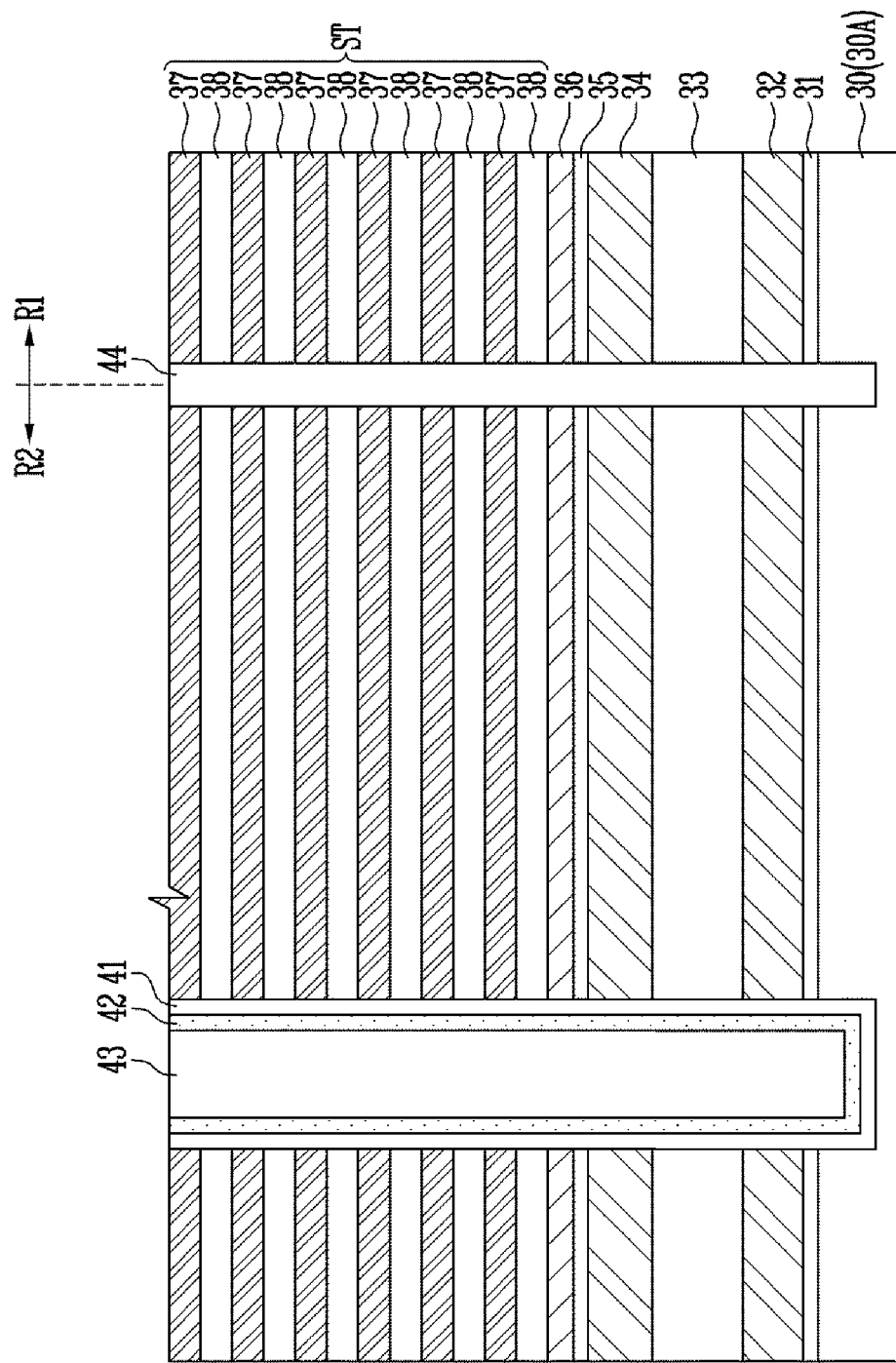
FIGS. 3A, 3B, 3C, 3D, 3E, 3F, 3G, 3H, and 3I are cross-sectional diagrams illustrating a method of manufacturing a semiconductor device, according to an embodiment.

Referring to FIG. 3A, an insulating layer 31, a first sacrificial layer 32, an insulating layer 33, a second sacrificial layer 34, an insulating layer 35, and an etch stop layer 36 may be sequentially formed on a base 30. The base may include an impurity region 30A doped with a P-type or N-type impurity. The impurity region 30A may be formed by doping an impurity into the base 30 or by depositing a polysilicon layer including an impurity. The impurity region 30A may be a source region or a well region.

The insulating layers 31, 33, and 35 may include an insulating material, such as an oxide. The insulating layers 31, 33, and 35 may have substantially the same thickness or different thicknesses from each other. For example, the insulating layer 33 interposed between the first sacrificial layer 32 and the second sacrificial layer 34 may insulate a first conductive plate and a second conductive plate to be formed during a subsequent process from each other, and thus may have a greater thickness than the insulating layers 31 and 35.

The first and second sacrificial layers 32 and 34 may include a material having a high etch selectivity with respect to the insulating layers 31, 33, and 35. For example, the insulating layers 31, 33, and 35 may be oxide layers, and the first and second sacrificial layers 32 and 34 may be undoped polysilicon layers.

The etch stop layer 36 may be provided to control a depth of an opening during a subsequent process for forming the opening. Accordingly, the etch stop layer 36 may include a material having high etch selectivity with respect to first and second material layers 37 and 38 to be formed during a subsequent process. In addition, the etch stop layer 36 may serve as a source plate or a well plate, with the second conductive plate to be formed during a subsequent process. Accordingly, the etch stop layer 36 may include polysilicon. For example, when the etch stop layer 36 is a portion of a source plate, the etch stop layer 36 may serve as a source of electrons for supplying electrons during a program operation and may be a polysilicon layer including an N-type impurity. In another example, when the etch stop layer 36 is a portion of a well plate, the etch stop layer 36 may serve as a source of positive holes for supplying positive holes during an erase operation and may be a polysilicon layer including a P-type impurity.

Subsequently, the stack structure ST may be formed on the etch stop layer 36. The stack structure ST may include the first material layers 37 and the second material layers 38 alternately stacked with each other. The first material layers 37 may be provided to form gate electrodes of memory cells and select transistors and the like. The second material layers 38 may be provided to insulate the stacked gate electrodes from each other.

The first material layers 37 may include a material having a high etch selectivity with respect to the second material layers 38. For example, each of the first material layers 37 may be a sacrificial layer including a nitride and the like, and each of the second material layers 38 may be an insulating layer including an oxide and the like. In another example, each of the first material layers 37 may be a conductive layer include polysilicon, tungsten, and the like, and each of the second material layers 38 may be an insulating layer including an oxide and the like. In another example, each of the first material layers 37 may be a conductive layer including a doped polysilicon and the like, and each of the second material layers 38 may be a sacrificial layer including an undoped polysilicon and the like.

Subsequently, a channel layer 42 passing through the stack structure ST, the etch stop layer 36, the insulating layers 31, 33, and 35, the second sacrificial layer 34 and the first sacrificial layer 32 is formed. For example, after forming an opening passing through the stack structure ST, the etch stop layer 36, the insulating layers 31, 33, and 35, the second sacrificial layer 34, and the first sacrificial layer 32, a memory layer 41 may be formed in the opening. Subsequently, the channel layer 42 and a gap-fill layer 43 may be formed in the memory layer 41. The memory layer 41 may include a charge blocking layer, a data storage layer, and a tunnel insulating layer. In addition, the data storage layer may include a floating gate, a charge trapping material, silicon, a nitride, a nanodot, a variable resistance material, a phase-change material, and the like.

A semiconductor pattern (see FIG. 1C) may be formed before forming the channel layer 42. The memory layer 41 may be formed after the semiconductor pattern is formed in an opening. Subsequently, after exposing an upper surface of the semiconductor pattern by etching the memory layer 41, the channel layer 42 and the gap-fill layer 43 may be formed.

Subsequently, a slit insulating structure 44 passing through the stack structure ST, the etch stop layer 36, the insulating layers 31, 33, and 35, the second sacrificial layer 34, and the first sacrificial layer 32 may be formed. For example, after forming an opening passing through the stack structure ST, the etch stop layer 36, the insulating layers 31, 33, and 35, the second sacrificial layer 34, and the first sacrificial layer 32, the slit insulating structure 44 may be formed in the opening. The slit insulating structure 44 may be disposed at a boundary between the first region R1 and the second region R2.

Figure 3B:
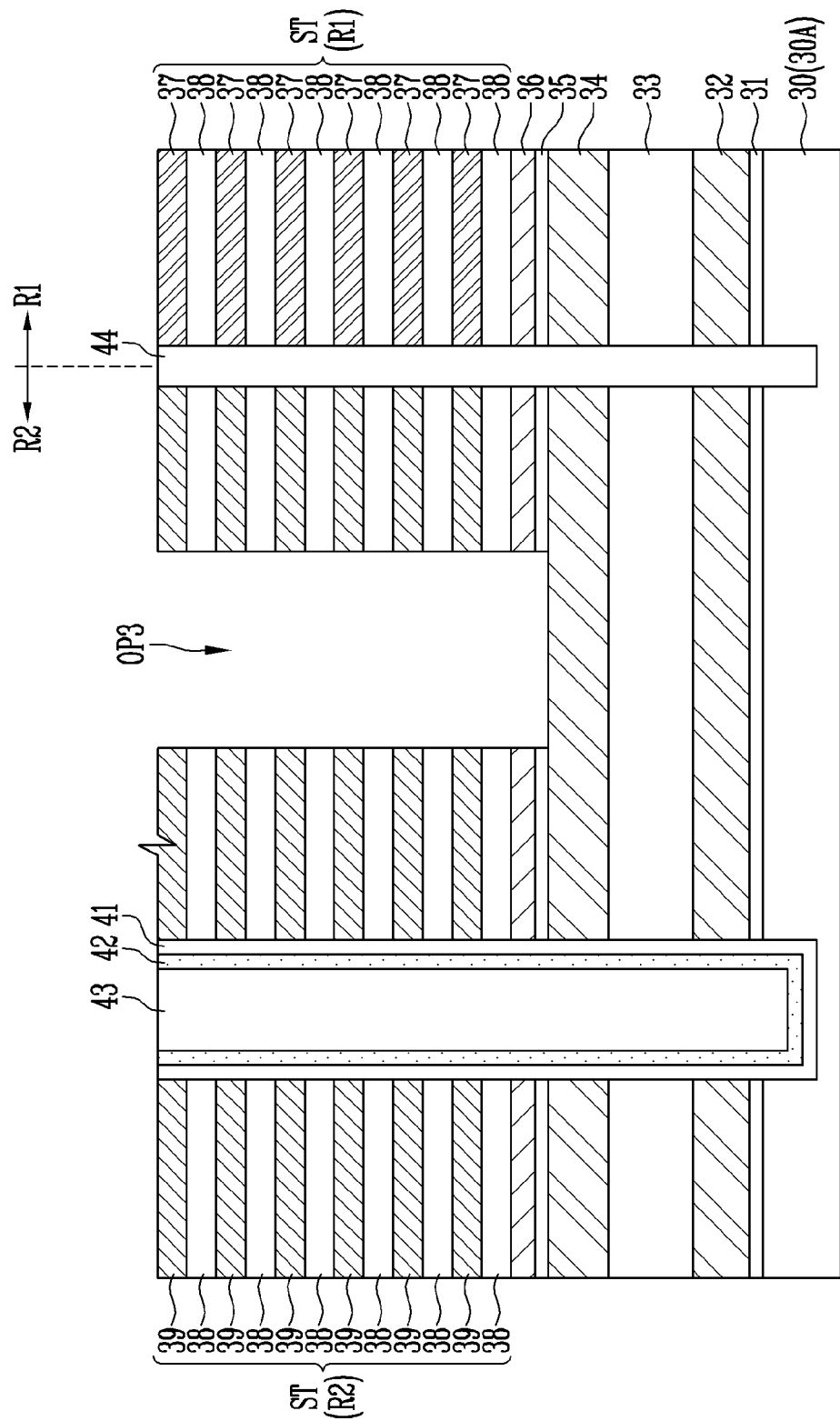

Referring to FIG. 3B, a third opening OP3 passing through the stack structure ST may be formed. The third opening OP3 may be formed using the etch stop layer 36. Accordingly, the third opening OP3 may have a depth at least to expose the etch stop layer 36. In addition, the third opening OP3 may be disposed in the second region R2 of the stack structure ST.

Subsequently, the first material layers 37 or the second material layers 38 may be replaced with third material layers 39 through the third opening OP3. For example, when the first material layers 37 are sacrificial layers and the second material layers 38 are insulating layers, the third material layers 39 may be formed in a region from which the first material layers 37 are removed after selectively removing the first material layers 37 through the third opening OP3. The first material layers 37 of the second region R2 which are isolated by the slit insulating structure 44 might not be replaced with the third material layers 39 and remain. In another example, when the first material layers 37 are conductive layers and the second material layers 38 are insulating layers, the first material layers 37 may be silicidated through the third opening OP3. In another example, when the first material layers 37 are conductive layers and the second material layers 38 are sacrificial layers, the third material layers 39 may be formed in a region from which the second material layers 38 are removed after removing the second material layers 38 through the third opening OP3.

Figure 3C:
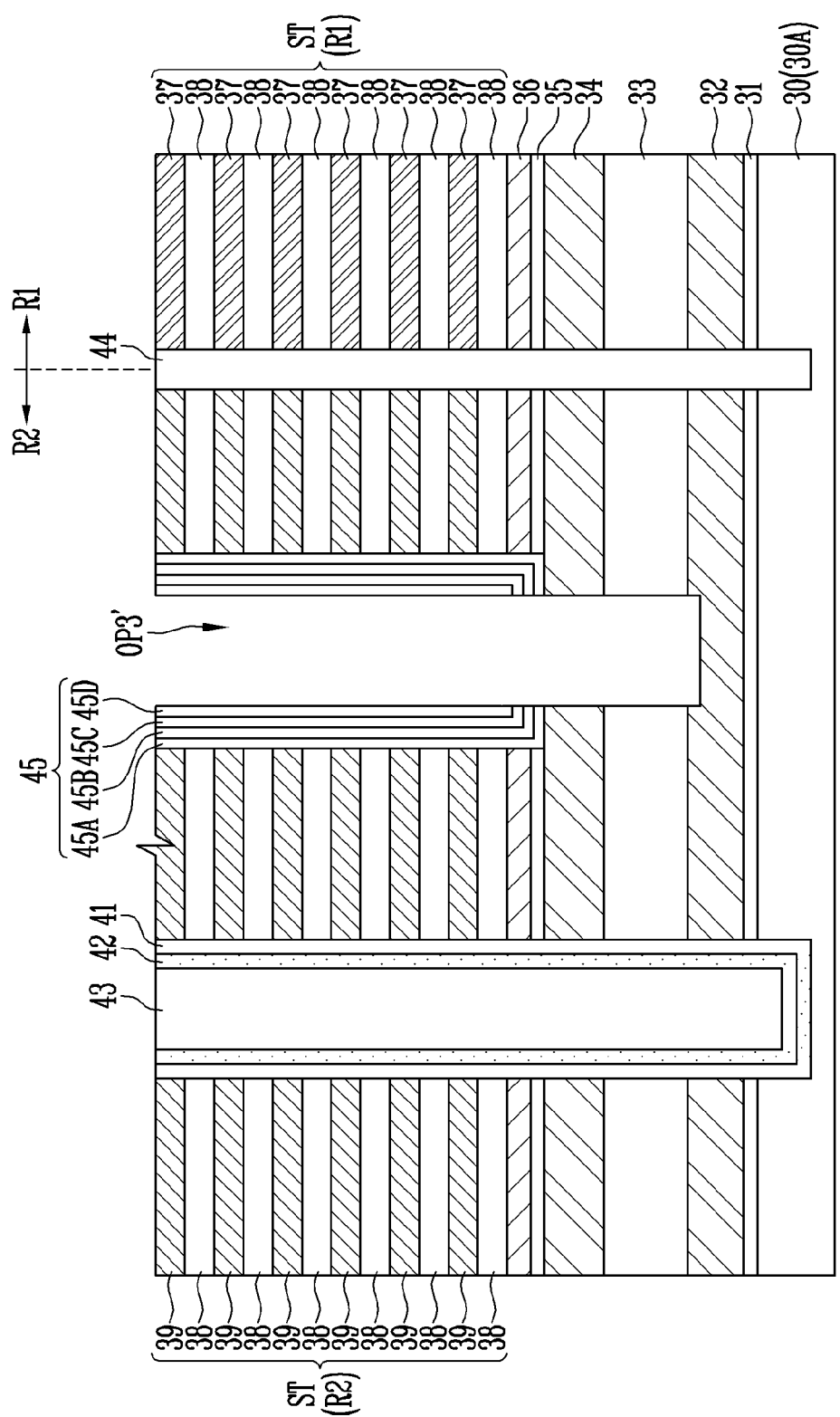

Referring to FIG. 3C, a first protective spacer 45 may be formed in the third opening OP3. For example, after forming a material layer for the first protective spacer along an inner surface of the third opening OP3, the material layer for the first protective spacer formed on a bottom surface of the third opening OP3 may be etched. Accordingly, the first protective spacer 45 may be formed. The first protective spacer 45 may be provided to protect the second and third material layers 38 and 39 during a subsequent process, and may include multiple layers. For example, the first protective spacer 45 may have a stacked structure in which third material layers 45A and 45C and fourth material layers 45B and 45D are alternately stacked with each other. The third material layers 45A and 45C may include a material having high etch selectivity with respect to the fourth material layers 45B and 45D. Each of the third material layers 45A and 45C may be an oxide layer and each of the fourth material layers 45B and 45D may be a nitride layer.

Subsequently, the third opening OP3 may extend to expose the first and second sacrificial layers 32 and 34. For example, the second sacrificial layer 34 and the insulating layer 33 may be etched using the first protective spacer 45 as an etching barrier. An extended third opening OP3' may extend to a depth that exposes a surface of the first sacrificial layer 32 and that possibly etches a portion of a thickness of the first sacrificial layer 32. Accordingly, the first and second sacrificial layers 32 and 34 may be exposed in the extended third opening OP3'.

Figure 3D:
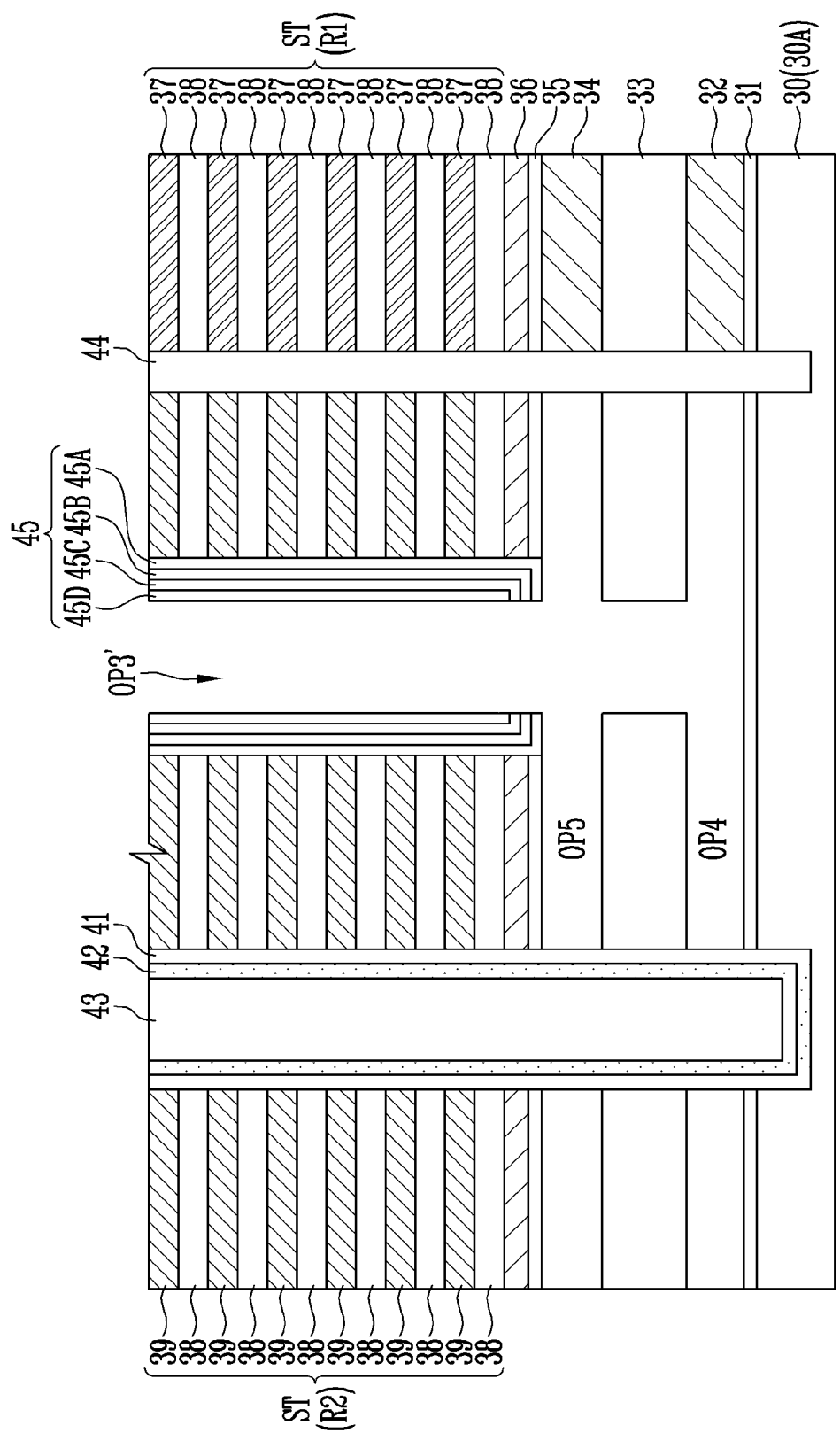

Referring to FIG. 3D, a fourth opening OP4 and a fifth opening OP5 may be formed by removing the first and second sacrificial layers 32 and 34 through the extended third opening OP3'. For example, the memory layer 41 may be exposed by selectively etching the first and second sacrificial layers 32 and 34.

Figure 3E:
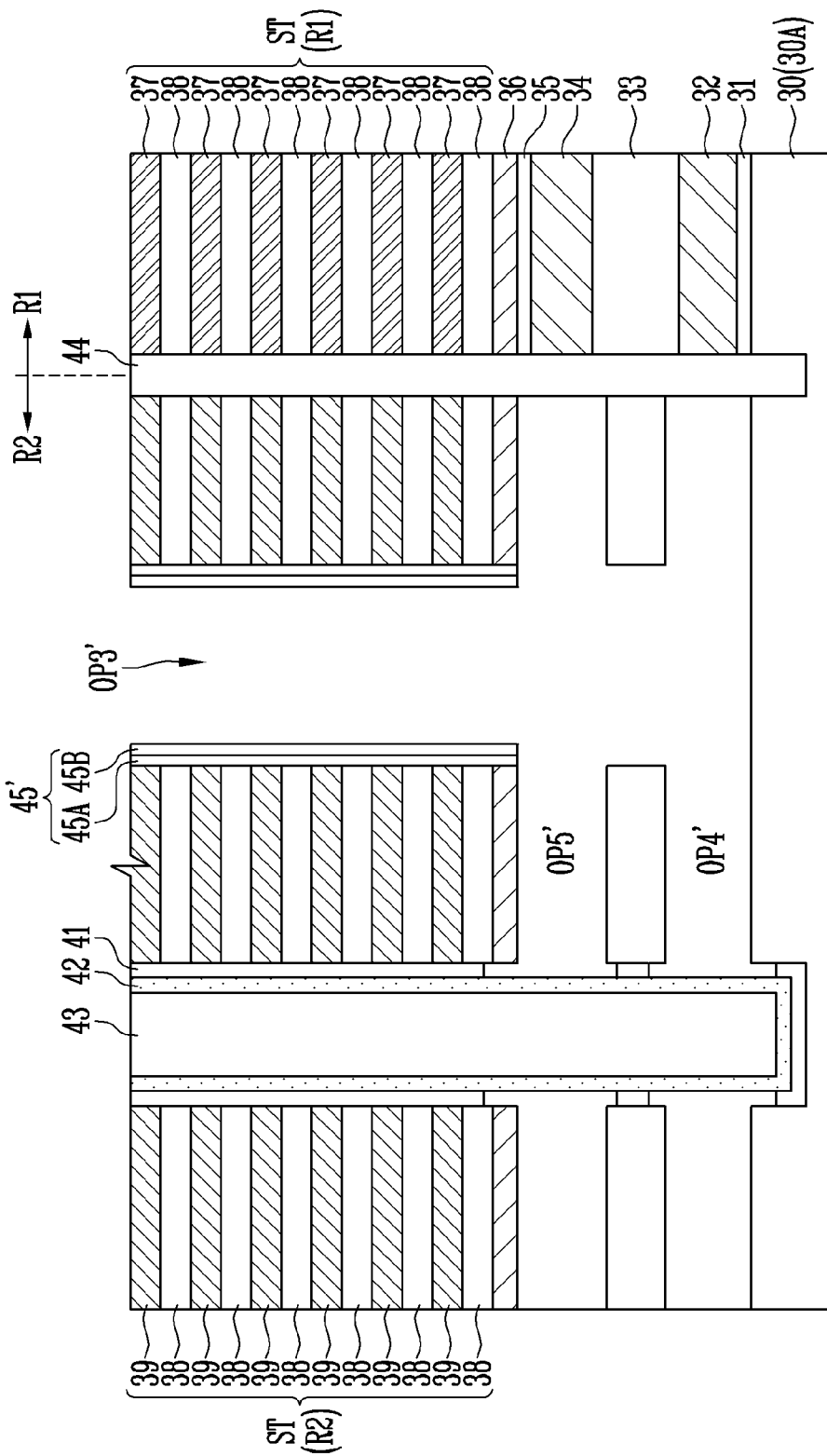

Referring to FIG. 3E, the channel layer 42 may be exposed by etching the memory layer 41 exposed through the fourth and fifth openings OP4 and OP5. A first protective spacer 45' may be partially etched during a process of etching the memory layer 41. For example, the third material layer 45C and the fourth material layer 45D may be etched. In addition, the insulating layers 31, 33, and 35 may be etched during the process of etching the memory layer 41. For example, the insulating layers 31 and 35 may be removed to expose the etch stop layer 36 and the base 30. In addition, a thickness of the insulating layer 33 may be decreased. Accordingly, extended fourth and fifth openings OP4' and OP5' may extend to the channel layer 42.

A region of the memory layer 41 which is interposed between the etch stop layer 36 and the channel layer 42 may be etched and the extended fifth opening OP5' may extend between the etch stop layer 36 and the channel layer 42 during the process of etching the memory layer 41. Meanwhile, the memory layer 41 interposed between the channel layer 42 and the insulating layer 33 may remain. Therefore, the extended fourth opening OP4' and the extended fifth opening OP5' may maintain a state in which the extended fourth opening OP4' and the extended fifth opening OP5' are separated from each other by the remaining memory layer 41 and insulating layer 33. In addition, the insulating layers 31, 33, and 35, and the first and second sacrificial layers 32 and 34 disposed under the first region R1 of the stack structure ST are protected by the slit insulating structure 44, and thus might not be etched and remain.

Figure 3F:
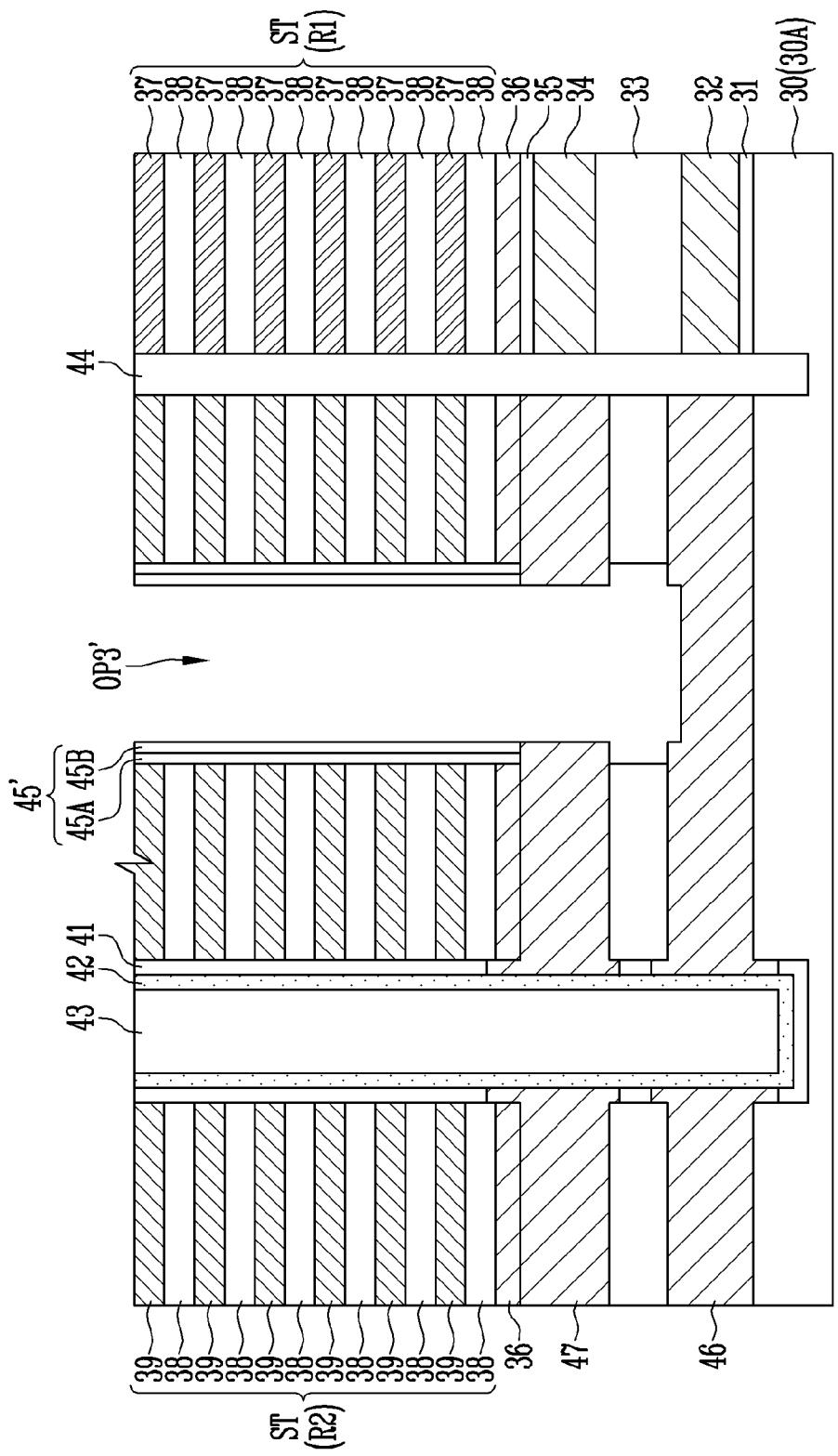

Referring to FIG. 3F, a first conductive plate 46 may be formed in the extended fourth opening OP4' and a second conductive plate 47 may be formed in the extended fifth opening OP5'. The first conductive plate 46 and the second conductive plate 47 may be simultaneously formed. For example, after depositing a conductive material using a deposition process so as to fill the extended fourth and fifth openings OP4' and OP5', the first conductive plate 46 and the second conductive plate 47 may be separated from each other by etching the conductive material formed in the extended third opening OP3'. Alternatively, the first and second conductive plates 46 and 47 may be formed using a selective growth method. The first and second conductive plates 46 and 47 may be undoped polysilicon layers.

The first and second conductive plates 46 and 47 may have a plate structure parallel to a surface of the base 30. In addition, each of the first and second conductive plates 46 and 47 may include protruding portions protruding upwards and/or downwards from a sidewall to contact the channel layer 42 according to a degree to which the memory layer 41 is etched during a preceding etching process of the memory layer 41. For example, the second conductive plate 47 may include a protruding portion interposed between the channel layer 42 and the etch stop layer 36, and/or a protruding portion interposed between the channel layer 42 and the insulating layer 33. The first conductive plate 46 may include a protruding portion interposed between the channel layer 42 and the base 30 and/or a protruding portion interposed between the channel layer 42 and the insulating layer 33.

The second conductive plate 47, for example, may serve as a source plate with the etch stop layer 36, and the first conductive plate 46 may serve as a well plate electrically coupled to the P-type impurity region 30A. In another example, the second conductive plate 47 may serve as a well plate with the etch stop layer 36 and the first conductive plate 46 may serve as a source plate electrically coupled to the N-type impurity region 30A.

Figure 3G:
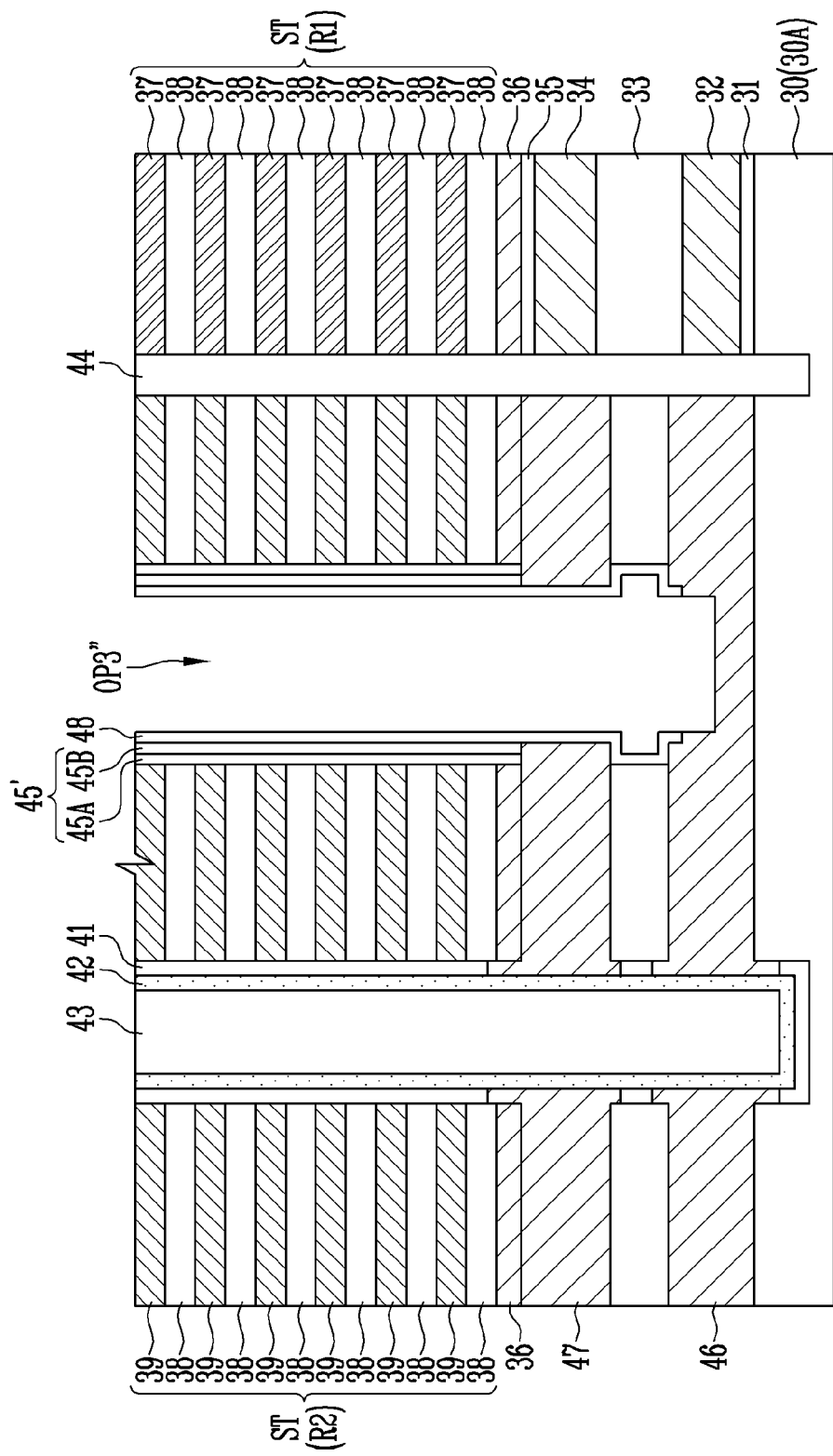

Referring to FIG. 3G, a second protective spacer 48 may be formed on an inner surface of the extended third opening OP3'. The second protective spacer 48 may be provided to prevent oxidization of a peripheral layer, such as the second conductive plate 47, during a subsequent oxidizing process and may include a nitride. For example, after forming a material layer for the second protective spacer 48 along the inner surface of the extended third opening OP3', the material layer for the second protective spacer 48 formed on a bottom surface of the extended third opening OP3' may be etched. Accordingly, the second protective spacer 48 may be formed. In addition, a further extended third opening OP3" may extend by etching a portion of a thickness of the first conductive plate 46 exposed through the extended third opening OP3'.

Figure 3H:
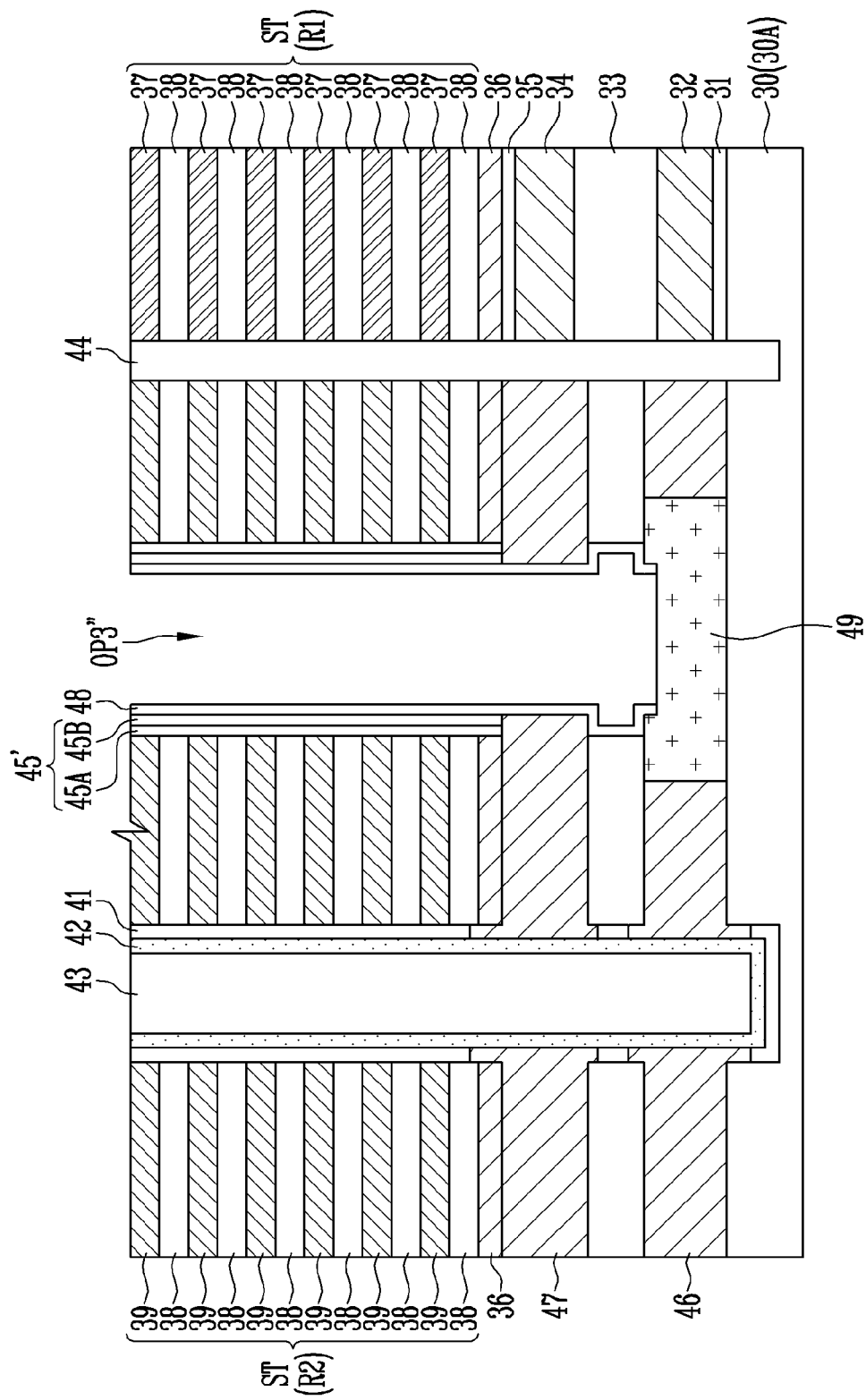

Referring to FIG. 3H, an insulating pattern 49 may be formed under the further extended third opening OP3". For example, the insulating pattern 49 may be formed by oxidizing the first conductive plate 46 exposed through the further extended third opening OP3" and a wet etching process may be used. Furthermore, the insulating pattern 49 may fill a portion of the further extended third opening OP3", for example, a lower portion of the further extended third opening OP3".

Figure 3I:
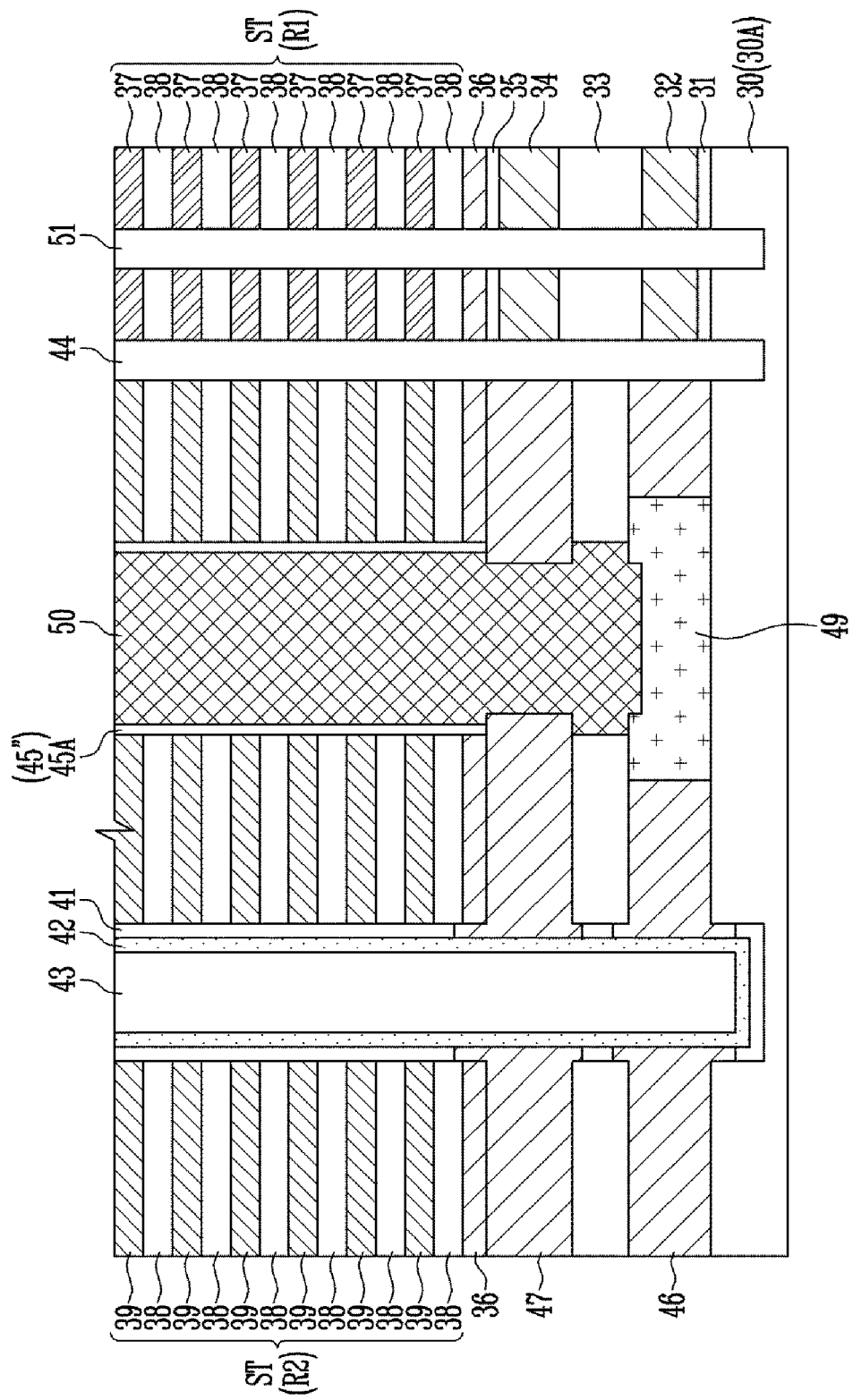

Referring to FIG. 3I, the second protective spacer 48 may be removed. The fourth material layer 45B of a first protective spacer 45" may also be removed. Subsequently, a second connection structure 50 may be formed in the further extended third opening OP3". The second connection structure 50 may include metal, such as tungsten, polysilicon, or a combination thereof.

The second connection structure 50 may pass through and may be electrically coupled to the etch stop layer 36 and the second conductive plate 47. In addition, the second connection structure 50 may be insulated from the stack structure ST by the first protective spacer 45" and may be insulated from the first conductive plate 46 by the insulating pattern 49. For example, when the second conductive plate 47 is a source plate, the second connection structure 50 may serve as a source connection structure. In another example, when the second conductive plate 47 is a well plate, the second connection structure 50 may serve as a well connection structure.

Subsequently, a first connection structure 51 passing through the first region R1 of the stack structure ST may be formed. For example, after forming an opening which passes through the stack structure ST, the etch stop layer 36, the insulating layers 31, 33, and 35, the first sacrificial layer 32, and the second sacrificial layer 34, and exposes the base 30, the first connection structure 51 may be formed by filling in a conductive material, such as tungsten. The first connection structure 51 may be electrically coupled to the impurity region 30A of the base 30, and may be electrically coupled to the first conductive plate 46 through the impurity region 30A. In addition, the first connection structure 51 may be insulated from the second conductive plate 47. For example, when the first conductive plate 46 is a well plate, the first connection structure may serve as a well connection structure. In another example, when the first conductive plate 46 is a source plate, the first connection structure 51 may be electrically coupled to the N-type impurity region 30A and may serve as a source connection structure.

According to the above-described manufacturing method, the first conductive plate 46 and the second conductive plate 47 may be simultaneously formed. In addition, the first conductive plate 46 and the second conductive plate 47 may be electrically separated from each other by the insulating layer 33. Accordingly, the manufacturing process may be simplified.

The first conductive plate 46 may serve as a well plate for providing an erase path, and the second conductive plate 47 may serve as a source plate for providing a program/read path. Alternatively, the first conductive plate 46 may serve as a source plate for providing a program/read path, and the second conductive plate 47 may serve as a well plate for providing an erase path. Operational characteristics of a memory device may be improved by separating a program/read path and an erase path from each other as described above.

FIGS. 4A to 4I are cross-sectional diagrams illustrating a method of manufacturing a semiconductor device, according to an embodiment. Repetitive descriptions of components already described above are omitted below.

Referring to FIG. 4A, an insulating layer 61, a first sacrificial layer 62, an insulating layer 63, a second sacrificial layer 64, an insulating layer 65, and an etch stop layer 66 may be sequentially formed on a base 60. The base 60 may include an impurity region 60A. The insulating layers 61, 63, and 65 may include an insulating material, such as an oxide. The first and second sacrificial layers 62 and 64 may include a material having a high etch selectivity with respect to the insulating layers 61, 63, and 65. For example, the insulating layers 61, 63, and 65 may be oxide layers, and the first and second sacrificial layers 62 and 64 may be undoped polysilicon layers. In addition, the etch stop layer 66 may be provided to control a depth of an opening during a subsequent process for forming the opening, and may be a polysilicon layer including an N-type or P-type impurity.

Subsequently, the stack structure ST may be formed on the etch stop layer 66. The stack structure ST may include first material layers 67 and second material layers 68 alternately stacked with each other. The first material layers 67 may be provided to form gate electrodes of memory cells and select transistors. The second material layers 68 may be provided to insulate the stacked gate electrodes from each other.

Subsequently, a channel layer 72 passing through the stack structure ST, the etch stop layer 66, the insulating layers 61, 63, and 65, the second sacrificial layer 64, and the first sacrificial layer 62 may be formed. For example, after forming an opening passing through the stack structure ST, the etch stop layer 66, the insulating layers 61, 63, and 65, the second sacrificial layer 64, the first sacrificial layer 62, and a memory layer 71 may be formed in the opening. Subsequently, the channel layer 72 and a gap-fill layer 73 may be formed. The memory layer 71 may include a charge blocking layer, a data storage layer, and a tunnel insulating layer.

Subsequently, a slit insulating structure 74 passing through the stack structure ST, the etch stop layer 66, the insulating layers 61, 63, and 65, the second sacrificial layers 64, and the first sacrificial layers 62 may be formed. For example, after forming an opening passing through the stack structure ST, the etch stop layer 66, the insulating layers 61, 63, and 65, the second sacrificial layer 64, and the first sacrificial layer 62, the slit insulating structure 74 may be formed in the opening. The silt insulating structure 74 may be disposed at, or may demarcate, a boundary between the first region R1 and the second region R2.

Figure 4B:
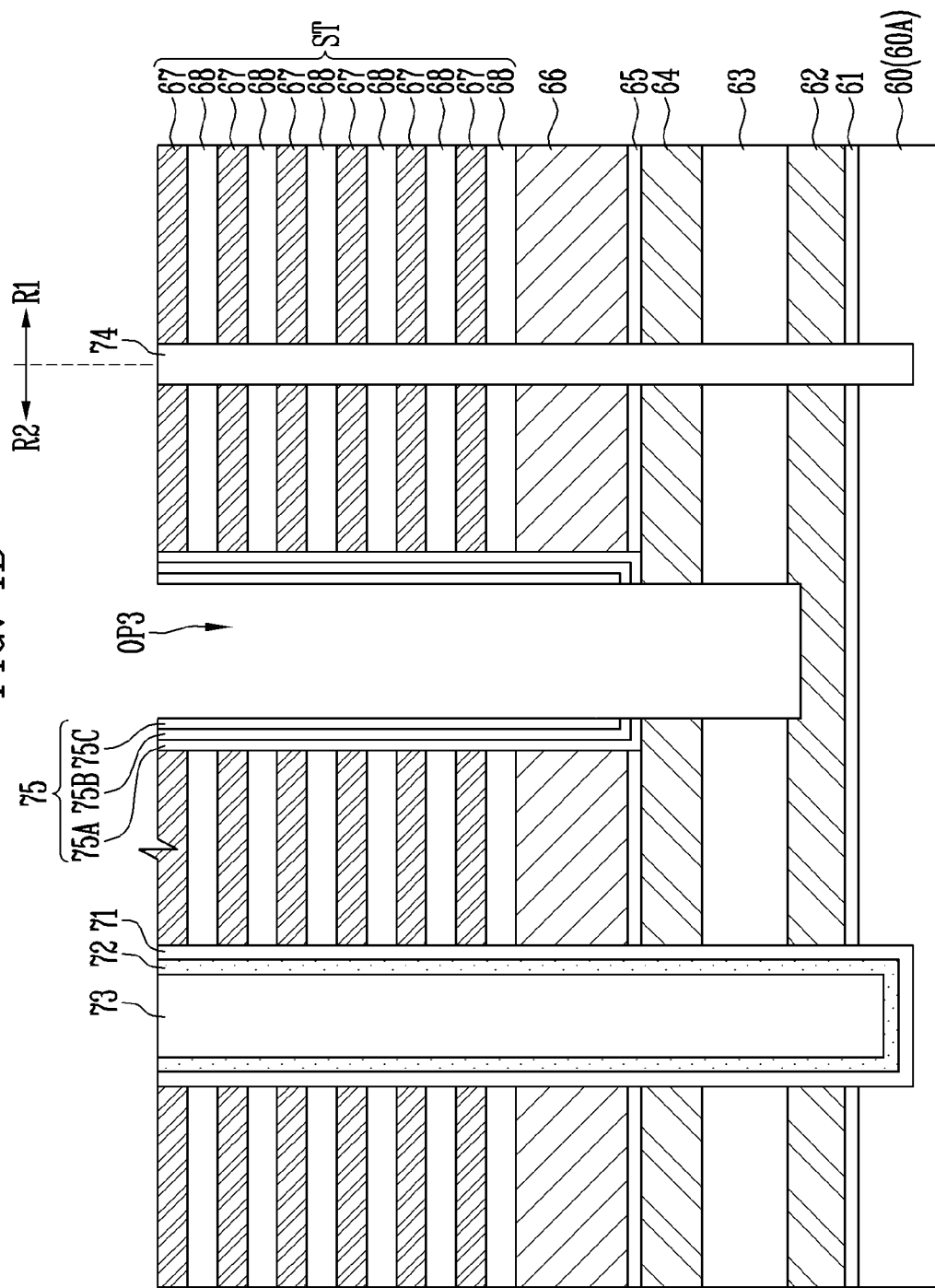

Referring to FIG. 4B, the third opening OP3 passing through the stack structure ST may be formed. The third opening OP3 may have a depth at least to expose the etch stop layer 66. In addition, the third opening OP3 may be disposed in the second region R2 of the stack structure ST.

Subsequently, a first protective spacer 75 may be formed on an inner surface of the third opening OP3. For example, after forming a material layer for the first protective spacer 75 along the inner surface of the third opening OP3, the material layer for the first protective spacer 75 formed on a bottom surface of the third opening OP3 may be etched. Accordingly, the first protective spacer 75 may be formed. The first protective spacer 75 may be provided to protect the first and second material layers 67 and 68 during a subsequent process, and may include multiple layers. For example, the first protective spacer 75 may have a stacked structure in which third material layers 75A and 75C and a fourth material layer 75B are alternately stacked with each other, and the third material layers 75A and 75C may include a material having a high etch selectivity with respect to the fourth material layer 75B. The third material layers 75A and 75C may be oxide layers and the fourth material layer 75B may be a nitride layer.

Subsequently, the third opening OP3 may be extended to expose the first and second sacrificial layers 62 and 64. For example, the second sacrificial layer 64 and the insulating layer 63 may be etched using the first protective spacer 75 as an etch barrier. The extended third opening OP3' may extend to have a depth to expose a surface of the first sacrificial layer 62 or to etch a portion of a thickness of the first sacrificial layer 62. Accordingly, the first and second sacrificial layers 62 and 64 may be exposed in the extended third opening OP3'.

Figure 4C:
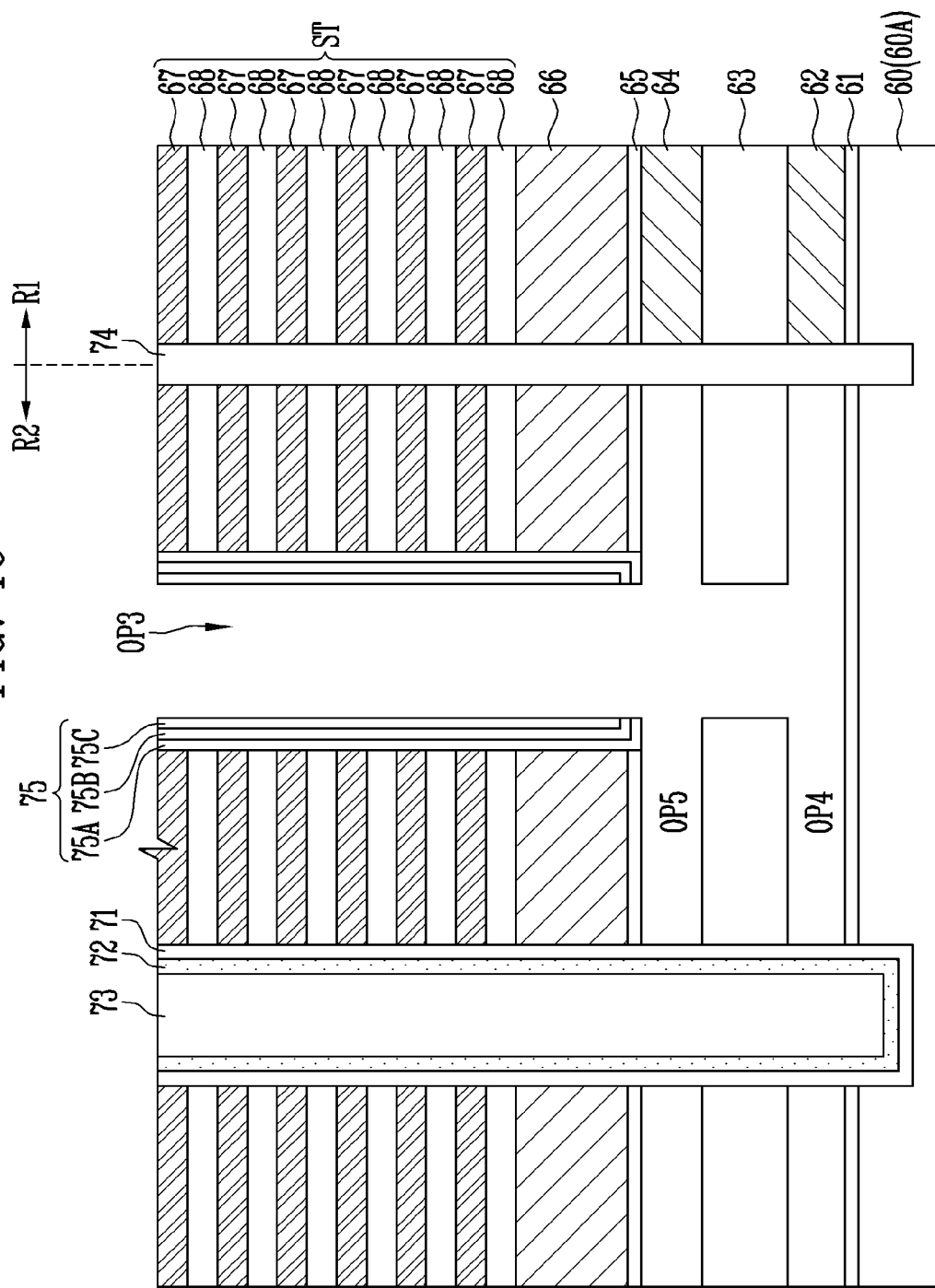

Referring to FIG. 4C, the fourth and fifth openings OP4 and OP5 may be formed by removing the first and second sacrificial layers 62 and 64 through the extended third opening OP3'. For example, the memory layer 71 may be exposed by selectively etching the first and second sacrificial layers 62 and 64.

Referring to FIG. 4D, the channel layer 72 may be exposed by etching the memory layer 71 exposed through the fourth and fifth openings OP4 and OP5. A first protective spacer 75' may be partially etched during a process of etching the memory layer 71. For example, the third material layer 75C and the fourth material layer 75B may be etched. In addition, the insulating layers 61, 63, and 65 may be etched during the process of etching the memory layer 71. For example, the insulating layers 61 and 65 may be removed to expose the etch stop layer 66 and the base 60. In addition, a thickness of the insulating layer 63 may be decreased. Accordingly, the extended fourth and fifth openings OP4' and OP5' may extend to the channel layer 72.

Figure 4E:
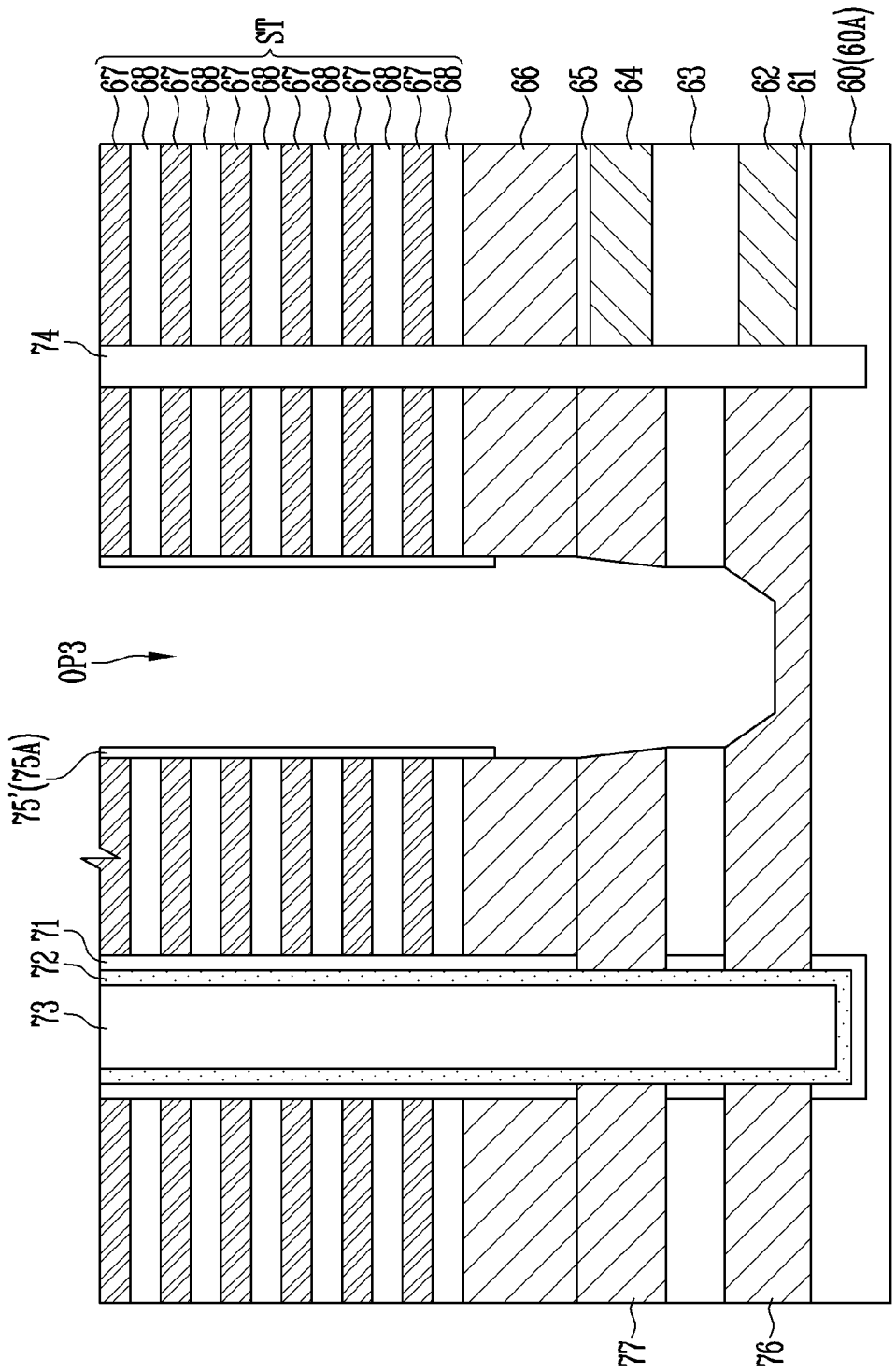

Referring to FIG. 4E, a first conductive plate 76 may be formed in the extended fourth opening OP4' and a second conductive plate 77 may be formed in the extended fifth opening OP5'. The first conductive plate 76 and the second conductive plate 77 may be simultaneously formed. For example, after depositing a conductive material using a deposition process so as to fill the extended fourth and fifth openings OP4' and OP5', the first conductive plate 76 and the second conductive plate 77 may be separated from each other by etching the conductive material formed in the third opening OP3. Alternatively, the first and second conductive plates 76 and 77 may be formed using a selective growth method. The first and second conductive plates 76 and 77 may be undoped polysilicon layers.

Figure 4F:
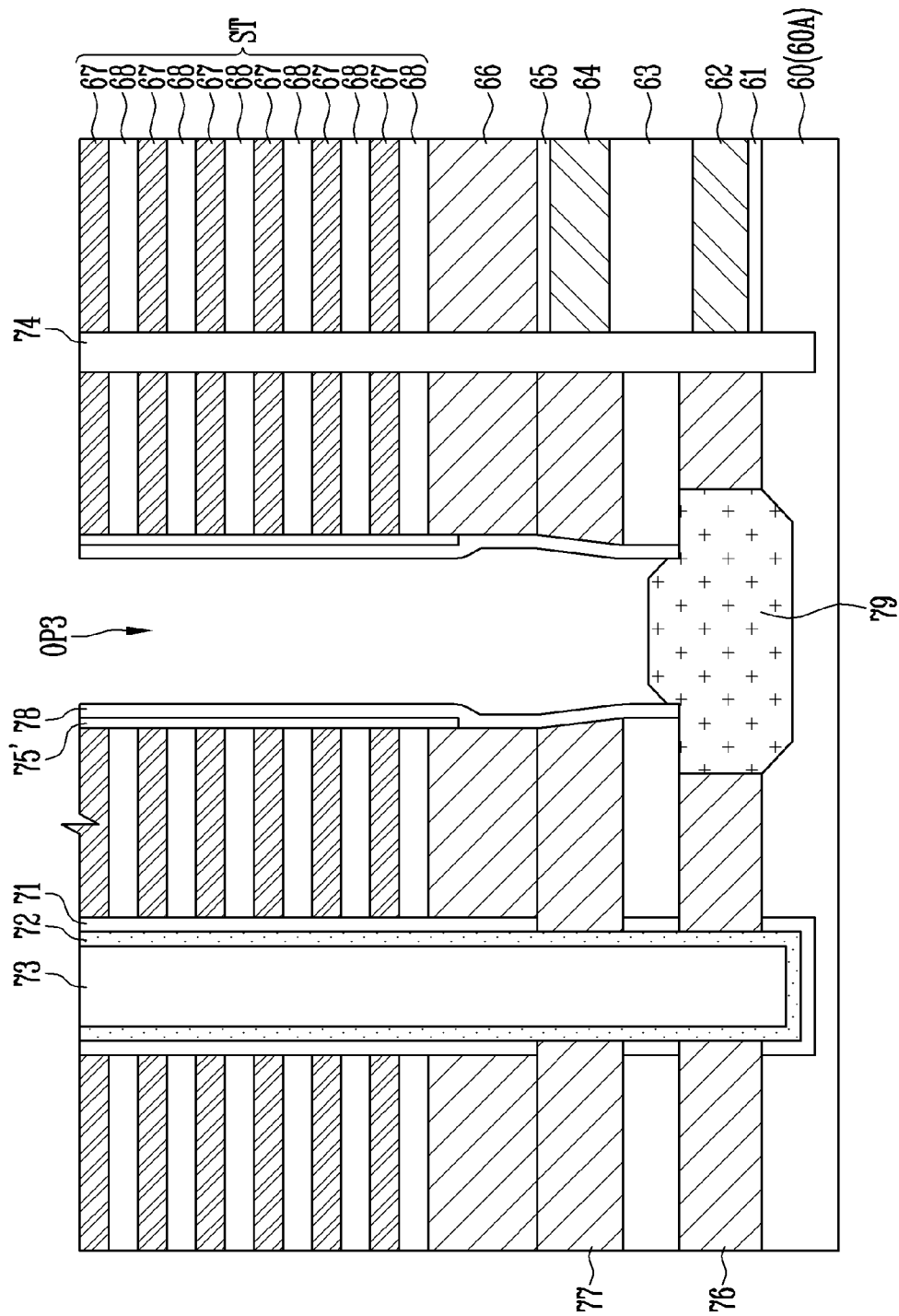

Referring to FIG. 4F, a second protective spacer 78 may be formed on an inner surface of the third opening OP3. For example, after forming a material layer for the second protective spacer 78 along the inner surface of the third opening OP3, the material layer for the second protective spacer 78 formed on a bottom surface of the third opening OP3 may be etched. Accordingly, the second protective spacer 78 may be formed.

Subsequently, an insulating pattern 79 may be formed under the third opening OP3. For example, the insulating pattern 79 may be formed by oxidizing the first conductive plate 76 exposed through the third opening OP3. Furthermore, the insulating pattern 79 may fill a portion of the third opening OP3, for example, a lower portion of the third opening OP3.

Figure 4G:
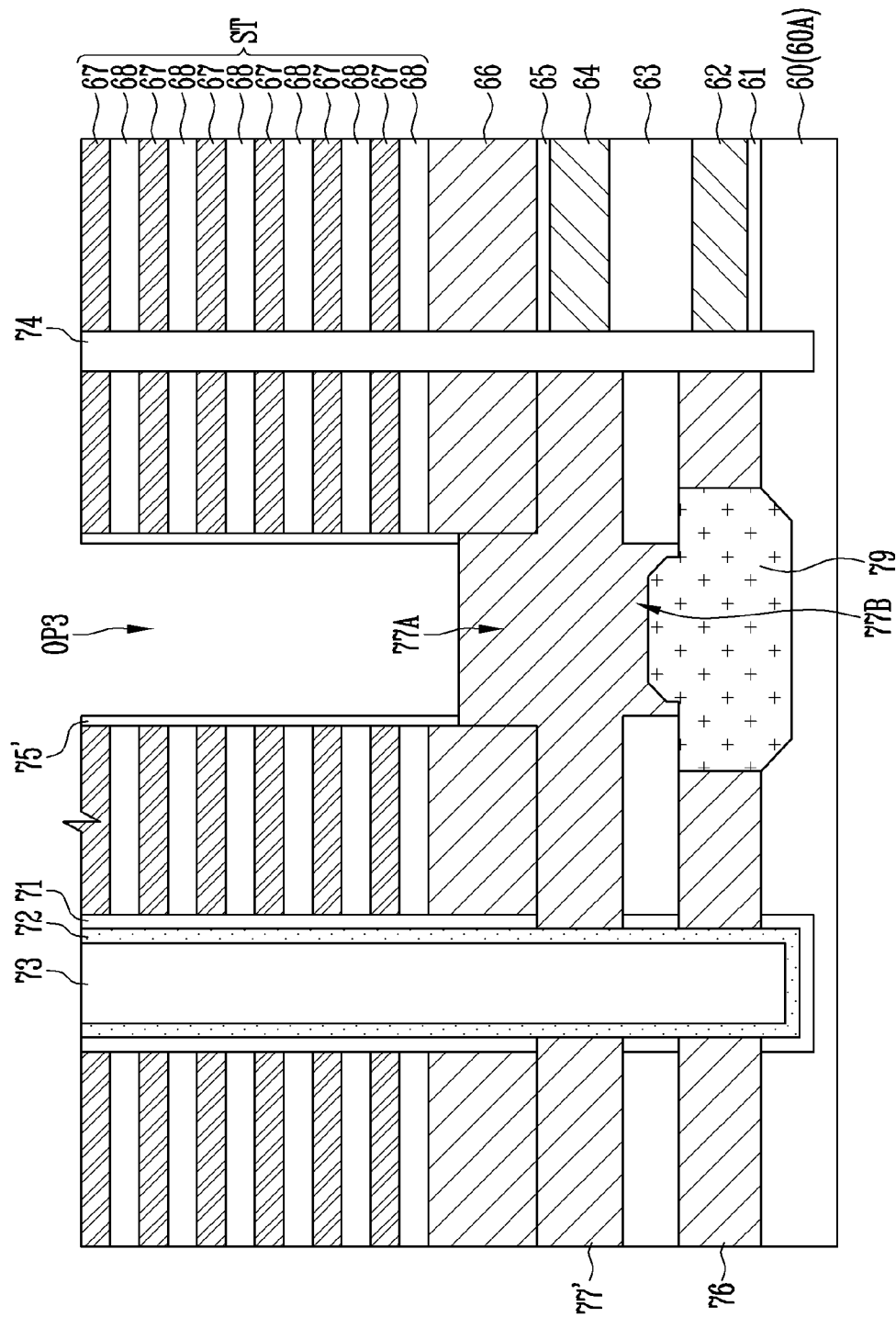

Referring to FIG. 4G, the second protective spacer 78 may be removed to expose the etch stop layer 66 and the second conductive plate 77 in the third opening OP3. Subsequently, a conductive material may be grown from the second conductive plate 77 to fill a lower portion of the third opening OP3. For example, a polysilicon layer may be grown from the second conductive plate 77 by a selective growth method. Accordingly, a second conductive plate 77' may extend to fill the lower portion of the third opening OP3 and the second conductive plate 77' may include a first protruding portion 77A protruding from an upper surface thereof and a second protruding portion 77B protruding from a lower surface thereof. The first protruding portion 77A may contact a sidewall of the etch stop layer 66, and impurities of the etch stop layer 66 may diffuse into the first protruding portion 77A.

Figure 4H:
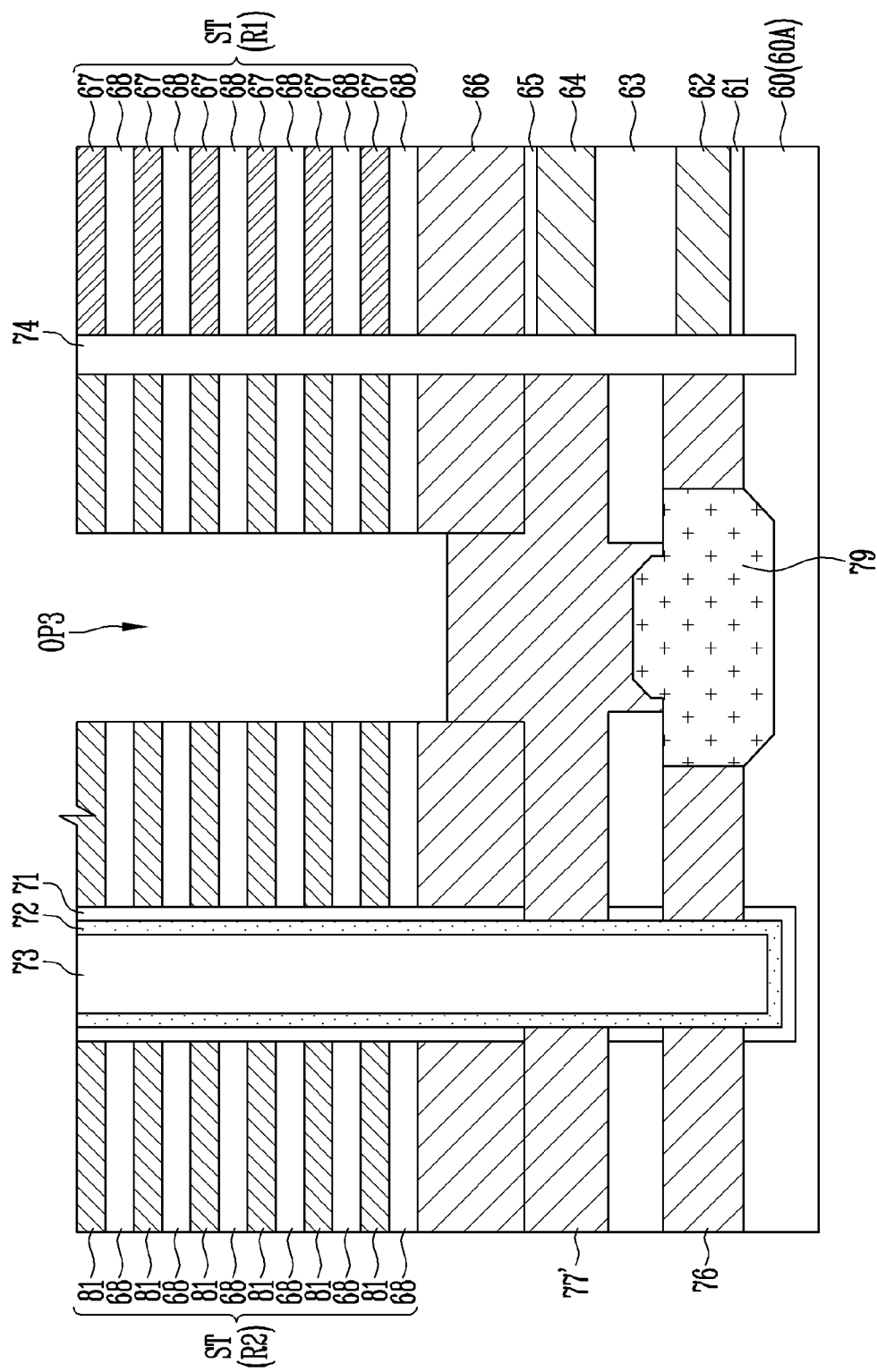

Referring to FIG. 4H, the first protective spacer 75' may be removed to expose the first material layers 67 in the third opening OP3. Subsequently, the first material layers 67 or the second material layers 68 may be replaced with third material layers 81 through the third opening OP3.

Figure 4I:
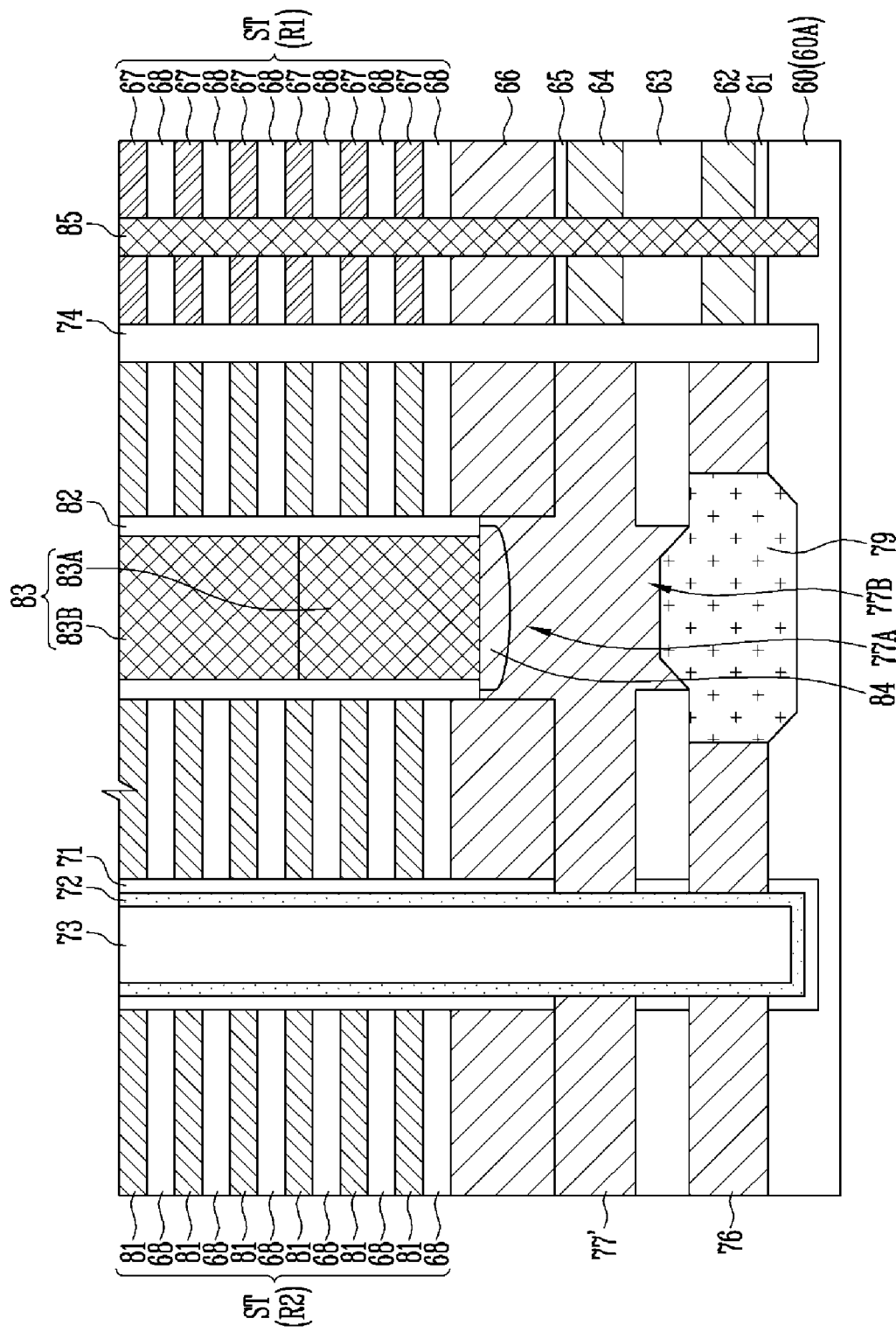

Referring to FIG. 4I, an insulating spacer 82 may be formed on an inner surface of the third opening OP3. For example, after forming a material layer for the insulating spacer 82 along the inner surface of the third opening OP3, a region formed on a bottom surface of the third opening OP3 may be etched. Accordingly, the insulating spacer 82 may be formed on the inner surface of the third opening OP3, and the second conductive plate 77' may be exposed at the bottom surface of the third opening OP3.

Subsequently, a junction 84 may be formed in the second conductive plate 77'. For example, the junction 84 may be formed by doping an N-type impurity into the first protruding portion 77A of the second conductive plate 77'. An impurity may be doped using an ion injection process.

Subsequently, a second connection structure 83 may be formed in the third opening OP3. The second connection structure 83 may pass through the stack structure ST and contact an upper surface of the second conductive plate 77'. Accordingly, the second connection structure 83 may be electrically coupled to the second conductive plate 77' and electrically separated from the first conductive plate 76. The second connection structure 83 may include a first conductive pattern 83A and a second conductive pattern 83B on the first conductive pattern 83A. For example, the first conductive pattern 83A may be a polysilicon layer grown from the second conductive plate 77'. The second conductive pattern 83B may include a material having a lower resistance than the first conductive pattern 83A and may include a metal such as tungsten. The second connection structure 83 may be a source connection structure or a well connection structure in different embodiments.

Subsequently, a first connection structure 85 passing through the first region R1 of the stack structure ST may be formed. For example, after forming an opening which passes through the stack structure ST, the etch stop layer 66, the insulating layers 61, 63, and 65, the first sacrificial layer 62, and the second sacrificial layer 64 and exposes the base 60, the opening may be filled with a conductive material, such as tungsten, to form the first connection structure 85. The first connection structure 85 may be electrically coupled to the first conductive plate 76 through the impurity region 60A and may be electrically separated from the second conductive plate 77'. The first connection structure 85 may be a well connection structure or a source connection structure.

According to the above-described manufacturing method, because the first conductive plate 76 and the second conductive plate 77' may be simultaneously formed, the manufacturing process is simplified. In addition, because the first conductive plate 76 and the second conductive plate 77' may be electrically separated from each other by the insulating layer 63, a program/read path and an erase path may also be separated from each other.

Figure 5:
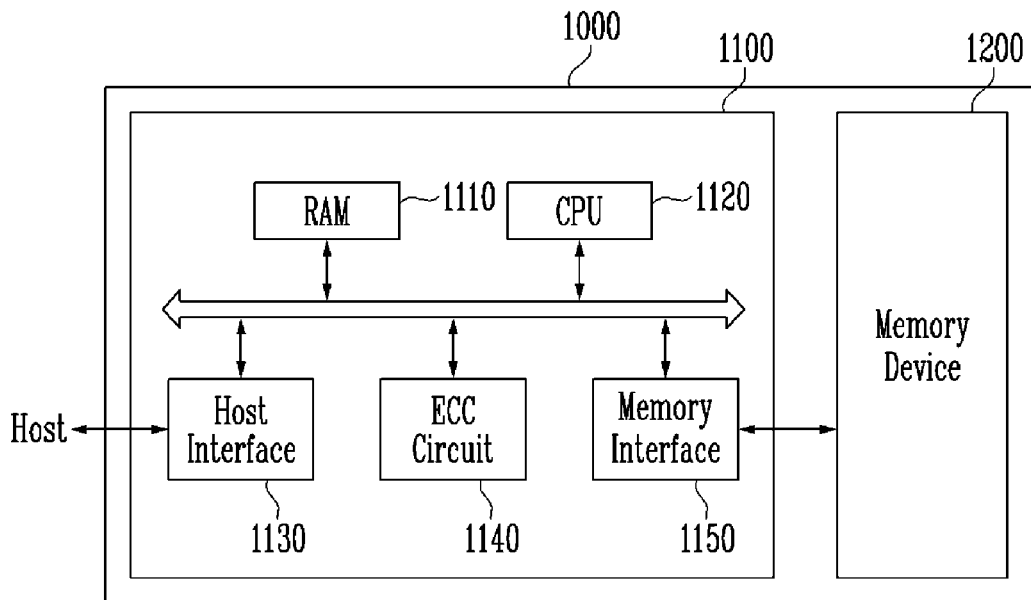
FIGS. 5 and 6 are block diagrams illustrating the configuration of a memory system, according to an embodiment.

FIG. 5 is a block diagram illustrating the configuration of a memory system 1000, according to an embodiment.

As illustrated in FIG. 5, the memory system 1000 may include a memory device 1200 and a controller 1100.

The memory device 1200 may be used to store data having a variety of data forms, such as text, graphics, and software codes. The memory device 1200 may be a non-volatile memory device. In addition, the memory device 1200 may have the structure described above with reference to FIGS. 1A to 4I, and may be manufactured by the manufacturing method described above with reference to FIGS. 1A to 4I. As an embodiment, the memory device 1200 may include a stack structure, a channel layer passing through the stack structure, a memory layer enclosing the channel layer, and include first and second openings which expose the channel layer, a well plate coupled to the channel layer through the first opening, and a source plate coupled to the channel layer through the second opening. The structure and the manufacturing method of the memory device 1200 are the same as the structure and the manufacturing method described above, therefore a repeated description is omitted here.

The controller 1100 may be coupled to a host and the memory device 1200, and may access the memory device 1200 in response to a request from the host. For example, the controller 1100 may control read, write, erase, and background operations of the memory device 1200.

The controller 1100 may include a Random Access Memory (RAM) 1110, a Central Processing Unit (CPU) 1120, a host interface 1130, an Error Correction Code (ECC) circuit 1140, and a memory interface 1150.

The RAM 1110 may serve as an operation memory of the CPU 1120, a cache memory between the memory device 1200 and the host, a buffer memory between the memory device 1200 and the host, and so forth. The RAM 1110 may be replaced with a Static Random Access Memory (SRAM), a Read Only Memory (ROM), or the like.

The CPU 1120 may control the overall operations of the controller 1100. For example, the CPU 1120 may be configured to operate firmware, such as a Flash Translation Layer (FTL) stored in the RAM 1110.

The host interface 1130 may be configured to interface with the host. For example, the controller 1100 is configured to communicate with the host through at least one of various interface protocols, such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, a private protocol, and the like.

The ECC circuit 1140 may use an Error Correction Code (ECC) to detect and correct errors in data read from the memory device 1200.

The memory interface 1150 may be configured to interface with the memory device 1200. For example, the memory interface 1150 may include a NAND interface or a NOR interface.

The controller 1100 may further include a buffer memory (not shown) for temporarily storing data. The buffer memory may be used to temporarily store data to be transferred through the host interface 1130 to an external device or data to be transferred through the memory interface 1150 from the memory device 1200. In addition, the controller 1100 may further include a ROM that stores code data for interfacing with the host.

Because the memory system 1000 according to an embodiment includes the memory device 1200 having improved integration density and characteristics, the memory system 1000 may also have improved integration density and improved characteristics accordingly.

Figure 6:
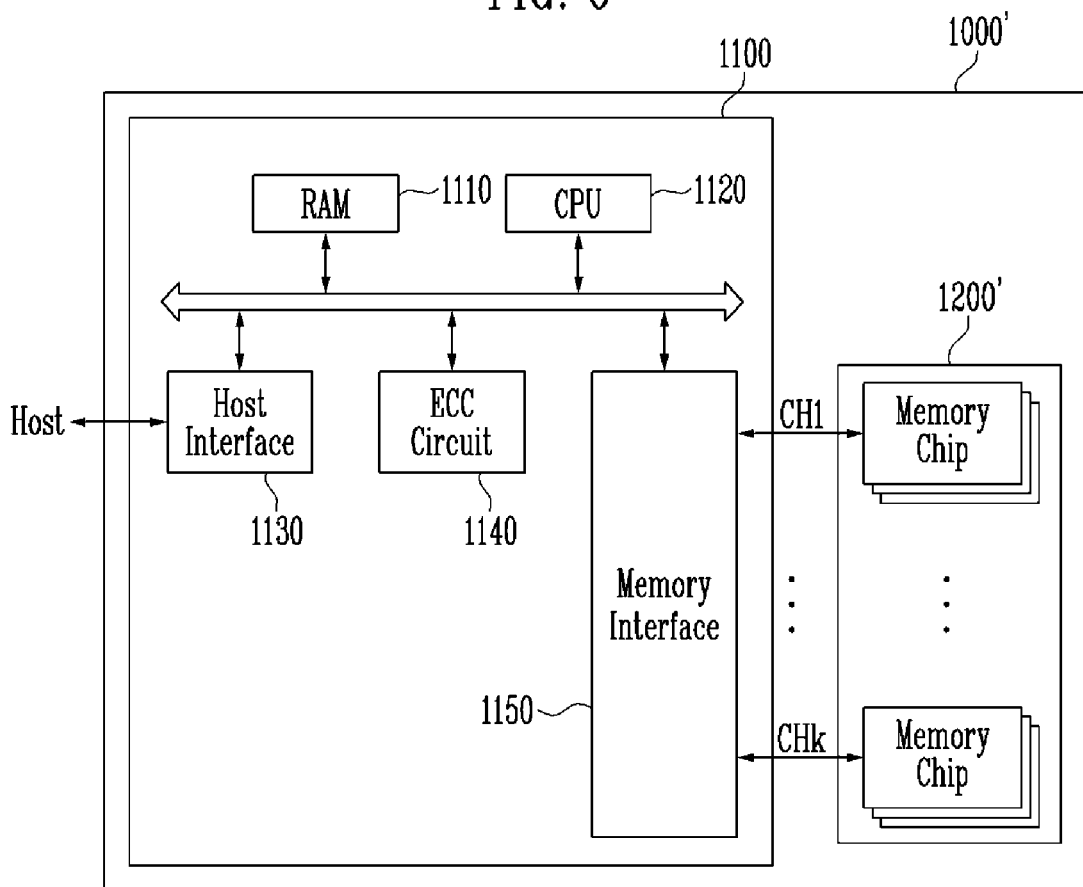

FIG. 6 is a block diagram illustrating the configuration of a memory system 1000', according to an embodiment. Repetitive descriptions of components already described above are omitted below.

Referring to FIG. 6, the memory system 1000' may include a memory device 1200' and the controller 1100. The controller 1100 includes the RAM 1110, the CPU 1120, the host interface 1130, the ECC circuit 1140, the memory interface 1150, and so on.

The memory device 1200' may be a non-volatile memory device. In addition, the memory device 1200' may have the structure described above with reference to FIGS. 1A to 4I, and may be manufactured by the manufacturing method described above with reference to FIGS. 1A to 4I. As an embodiment, the memory device 1200' may include a stack structure, a channel layer passing through the stack structure, a memory layer enclosing the channel layer and including first and second openings which expose the channel layer, a well plate coupled to the channel layer through the first opening, and a source plate coupled to the channel layer through the second opening. The structure and the manufacturing method of the memory device 1200' are the same as the structure and the manufacturing method described above, therefore a repeated description is omitted here.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips included in a common group may be suitable for communicating with the controller 1100 through a common channel. The memory system 1000' may be modified so that a single memory chip may be coupled to a single channel.

Because the memory system 1000' includes the memory device 1200' having improved integration density and characteristics, integration density and characteristics of the memory system 1000' may also be improved. In addition, because the memory device 1200' is formed using a multi-chip package, data storage capacity and driving speed of the memory system 1000' may be further increased.

Figure 7:
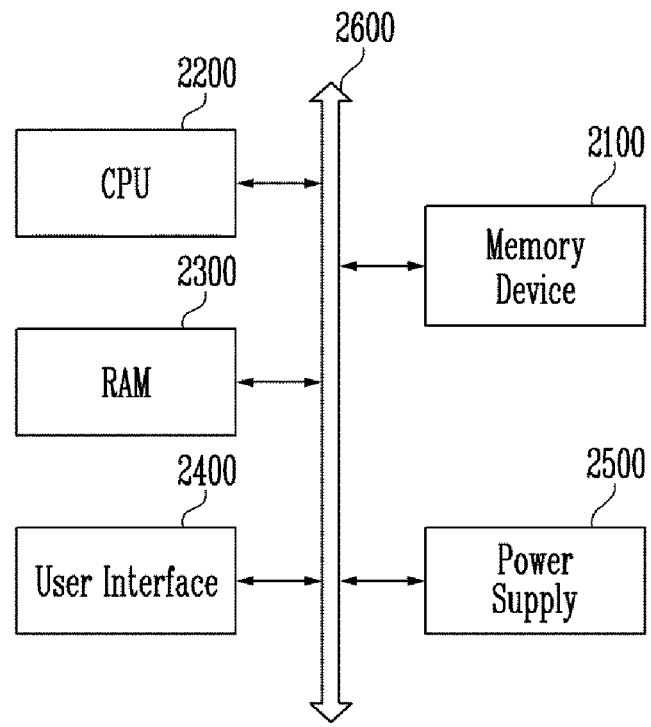
FIGS. 7 and 8 are block diagrams illustrating the configuration of a computing system, according to an embodiment.

FIG. 7 is a block diagram illustrating a configuration of a computing system 2000, according to an embodiment. Repetitive descriptions of components already described above are omitted below.

Referring to FIG. 7, the computing system 2000 may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. Furthermore, the memory device 2100 may be electrically coupled to the CPU 2200, the RAM 2300, the user interface 2400, the power supply 2500, etc., by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a non-volatile memory. In addition, the memory device 2100 may have the structure described above with reference to FIGS. 1A to 4I and may be manufactured by the manufacturing method described above with reference to FIGS. 1A to 4I. As an embodiment, the memory device 2100 may include a stack structure, a channel layer passing through the stack structure, a memory layer enclosing the channel layer and including first and second openings which expose the channel layer, a well plate coupled to the channel layer through the first opening, and a source plate coupled to the channel layer through the second opening. Because the memory device 2100 is configured and manufactured in the same manner as the memory devices 1200 or 1200', a repeated description is omitted here.

In addition, as described above with reference to FIG. 6, the memory device 2100 may be a multi-chip package composed of a plurality of memory chips.

The computing system 2000 having the above-mentioned configuration may be provided as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices for forming a home network, one of various electronic devices for forming a computer network, one of various electronic devices for forming a telematics network, an RFID device, or the like.

As described above, because the computing system 2000 according to the embodiment includes the memory device 2100 having improved integration density and characteristics, characteristics of the computing system 2000 may also be improved.

Figure 8:
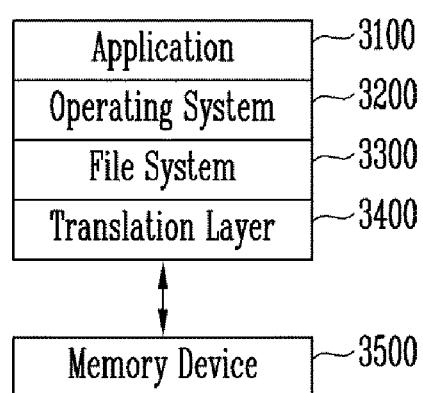

FIG. 8 is a block diagram illustrating a computing system 3000, according to an embodiment.

As illustrated in FIG. 8, the computing system 3000 may include a software layer that has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may be various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is Microsoft's Windows operating system, the file system 3300 may be a File Allocation Table (FAT), an NT file system (NTFS), or the like. When the operating system 3200 is a Unix/Linux system, the file system 3300 may be an extended file system (EXT), a Unix File System (UFS), a Journaling File System (JFS), or the like.

FIG. 8 illustrates the operating system 3200, the application 3100, and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logical address produced by the file system 3300 into a physical address of the memory device 3500. Mapping information of the logical address and the physical address may be stored as an address translation table. For example, the translation layer 3400 may be a Flash Translation Layer (FTL), a Universal Flash Storage Link Layer (ULL), or the like.

The memory device 3500 may be a non-volatile memory. In addition, the memory device 3500 may have the structure described above with reference to FIGS. 1A to 4I and may be manufactured by the manufacturing method described above with reference to FIGS. 1A to 4I. As an embodiment, the memory device 3500 may include a stack structure, a channel layer passing through the stack structure, a memory layer enclosing the channel layer and including first and second openings which expose the channel layer, a well plate coupled to the channel layer through the first opening, and a source plate coupled to the channel layer through the second opening. Because the memory device 3500 is configured and manufactured in the same manner as described above, a repeated description is omitted here.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. In addition, the translation layer 3400 may be included in the operating system layer or the controller layer.

As described above, because the computing system 3000 according to an embodiment includes the memory device 3500 having improved integration density and characteristics, characteristics of the computing system 3000 may also be improved.

In accordance with various embodiments, a semiconductor device having a stabilized structure and improved reliability may be provided. In addition, a process of manufacturing a semiconductor device may be simplified with lower manufacturing costs.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in forms and details may be made without departing from the spirit and scope set forth in the following claims.

What is claimed is:

1. A semiconductor device, comprising:
    a well plate;
    a source plate insulated from the well plate;
    a stack structure including conductive layers and first insulating layers alternately stacked with each other;
    a channel layer passing through the stack structure, the well plate and the source plate; and
    a memory layer enclosing the channel layer to be interposed between the conductive layers and the channel layer, wherein the memory layer includes first and second openings which expose a sidewall of the channel layer,
    wherein the well plate contacts the channel layer through the first opening, and
    wherein the source plate contacts the channel layer through the second opening.

2. The semiconductor device of claim 1, further comprising:
    a source connection structure passing through the stack structure and electrically coupled to the source plate; and
    a well connection structure passing through the stack structure and electrically coupled to the well plate.

3. The semiconductor device of claim 2, wherein the stack structure comprises:

sacrificial layers and the first insulating layers alternately stacked with each other in a first region; and the conductive layers and the first insulating layers alternately stacked with each other in a second region.

4. The semiconductor device of claim 3, further comprising a slit insulating structure passing through the stack structure at a boundary between the first region and the second region.

5. The semiconductor device of claim 3, wherein the source connection structure is disposed in the second region and the well connection structure is disposed in the first region.

6. The semiconductor device of claim 3, wherein the source connection structure comprises:

a first conductive pattern coupled to the source plate; and a second conductive pattern coupled to the first conductive pattern, wherein the second conductive pattern has a lower resistance than the first conductive pattern.

7. The semiconductor device of claim 1, wherein the source plate is disposed above the well plate.

8. The semiconductor device of claim 1, wherein the source plate is disposed under the well plate.

9. The semiconductor device of claim 1, wherein the source plate comprises:

a first conductive layer; and a second conductive layer formed on the first conductive layer.

10. The semiconductor device of claim 9, wherein the first conductive layer includes a first protruding portion protruding from an upper surface of the first conductive layer and a second protruding portion protruding from a lower surface of the first conductive layer.

11. The semiconductor device of claim 10, further comprising a source connection structure passing through the stack structure and coupled to the first protruding portion.

12. The semiconductor device of claim 10, wherein the first conductive layer further includes a junction formed in the first protruding portion.

13. The semiconductor device of claim 1, further comprising:

a source connection structure passing through the stack structure and electrically coupled to the source plate; and an insulating spacer enclosing a sidewall of the source connection structure.

14. The semiconductor device of claim 13, wherein the source connection structure passes through the source plate and extends beyond a lower surface of the source plate.

15. The semiconductor device of claim 13, further comprising an insulating pattern disposed under the source connection structure, wherein the insulating pattern electrically insulates the source connection structure from the well plate.

16. A semiconductor device, comprising:

a base;

a stack structure including gate electrode layers stacked on the base;

a well plate interposed between the base and the stack structure;

a source plate interposed between the base and the stack structure;

a channel layer passing through the stack structure, the well plate and the source plate; and a memory layer enclosing a sidewall of the channel layer, wherein the memory layer is interposed between the gate electrode layers and the channel layer and extends to the base, wherein the well plate passes through the memory layer and directly contacts the sidewall of the channel layer, and wherein the source plate passes through the memory layer and directly contacts the sidewall of the channel layer.

* * * * *